United States Patent [19]
Noe

[11] Patent Number: 5,347,529
[45] Date of Patent: Sep. 13, 1994

[54] METHOD FOR GENERATING A DISTORTION-FREE, FREQUENCY-MODULATED OPTICAL SIGNAL AND APPARATUS FOR THE IMPLEMENTATION OF SUCH A METHOD

[75] Inventor: Reinhold Noe, Paderborn, Fed. Rep. of Germany

[73] Assignee: Siemens Aktiengesellschaft, Munich, Fed. Rep. of Germany

[21] Appl. No.: 95,401

[22] Filed: Jul. 23, 1993

[30] Foreign Application Priority Data

Aug. 7, 1992 [DE] Fed. Rep. of Germany ....... 4226187

[51] Int. Cl.$^5$ .................. H01S 3/10; H01S 3/091
[52] U.S. Cl. .................................. 372/28; 372/26; 372/70; 372/33; 372/38; 330/75; 330/149; 359/249; 359/344; 359/345; 359/187; 359/188
[58] Field of Search ............... 372/26, 28, 31, 32, 372/34, 33, 43, 50, 69, 70, 96, 109, 38; 330/149, 75; 359/249, 111, 187, 188, 127, 140, 153, 161, 344, 345, 885; 385/1, 2, 4, 8, 9, 42

[56] References Cited

U.S. PATENT DOCUMENTS

| | | | |
|---|---|---|---|
| 4,149,071 | 4/1979 | Nagai et al. | 332/7.51 |
| 4,992,754 | 2/1991 | Blauvelt et al. | 330/149 |
| 5,132,639 | 7/1992 | Blauvelt et al. | 330/149 |
| 5,146,359 | 9/1992 | Okoshi et al. | 359/189 |
| 5,161,044 | 11/1992 | Nazarathy et al. | 359/157 |
| 5,168,503 | 12/1992 | Maeda | 372/28 X |
| 5,185,756 | 2/1993 | Olshansky et al. | 372/28 X |
| 5,222,089 | 6/1993 | Huber | 372/26 |
| 5,252,930 | 10/1993 | Blauvelt | 330/149 |
| 5,255,274 | 10/1993 | Wysocki et al. | 372/28 X |
| 5,255,276 | 10/1993 | Tabuchi et al. | 372/28 X |

FOREIGN PATENT DOCUMENTS

| | | | |
|---|---|---|---|
| 0416622 | 3/1991 | European Pat. Off. | 330/149 X |
| 3307309 | 9/1984 | Fed. Rep. of Germany | 330/149 X |
| 04007882 | 4/1992 | Japan | 372/43 X |

OTHER PUBLICATIONS

"Frequency Modulation Characteristics Of Tunable Twin–Guide (TTG) DFB Lasers", K. Drögemüller et al, 16th European, vol. 1 Conference on Optical Communication, ECOC 90, Sep. 16–20, 1990, Amsterdam, NL, pp. 181–184.

"Optical FSK Transmission with Pattern–Independent 119 Photoelectrons/Bit Receiver Sensitivity and Endless Polarisation Control", R. Noe et al, Electronics Letters, vol. 25, No. 12, Jun. 8, 1989, pp. 757–758.

"Pattern–Independent FSK Heterodyne Transmission with AMI Signal Format and Two Channel Crosstalk Measurements", R. Noe et al, Journal of Optical Communnications 10 (1989) 3, pp. 82–84.

"1 Gbit/s Bipolar Optical FSK Transmission Experiment Over 121 km of Fibre", R. S. Vodhanel et al, Electronics Letters 24 (1988) 3, pp. 163–165.

"Adaptive Quantised Feedback Equalisation for FSK Heterodyne Transmission at 150 Mbit/s and 1 Gbit/s", B. Enning et al, Electronics Letters, vol. 24, No. 7, Mar. 31, 1988, pp. 397–399.

"Polarisation–Insensitive, 500 Mbit/s FSK Transmission over 153km by Passive Polarisation Switching", R. Noe et al, Electronics Letter, vol. 25, No. 1, Jan. 5, 1989, pp. 4–5.

"Frequency Modulation Characteristics of Tunable Twin–Guide (TTG) DFB Lasers", K. Drögemüller et al, Research Laboratories of Siemens AG, ECOC 1990, pp. 181–184.

*Primary Examiner*—Brian Healy

[57] ABSTRACT

Method and apparatus for generating a distortion-free, frequency-modulated optical signal, whereby this signal from an optical semiconductor laser driven with a modulating voltage is distorted by the modulating voltage due to a thermally conditioned frequency transfer function of the transmitter for the modulation frequency of the modulating voltage. For generating the distortion-free, frequency-modulated optical signal, the modulating voltage and/or the distorted, frequency-modulated optical signal itself and/or a superimposition signal containing this optical signal is subjected to a distortion that entirely or partially compensates the distortion of this optical signal. This method is simple and, in combination with receivers for the frequency-modulated optical signal, avoids sensitivity losses.

38 Claims, 5 Drawing Sheets

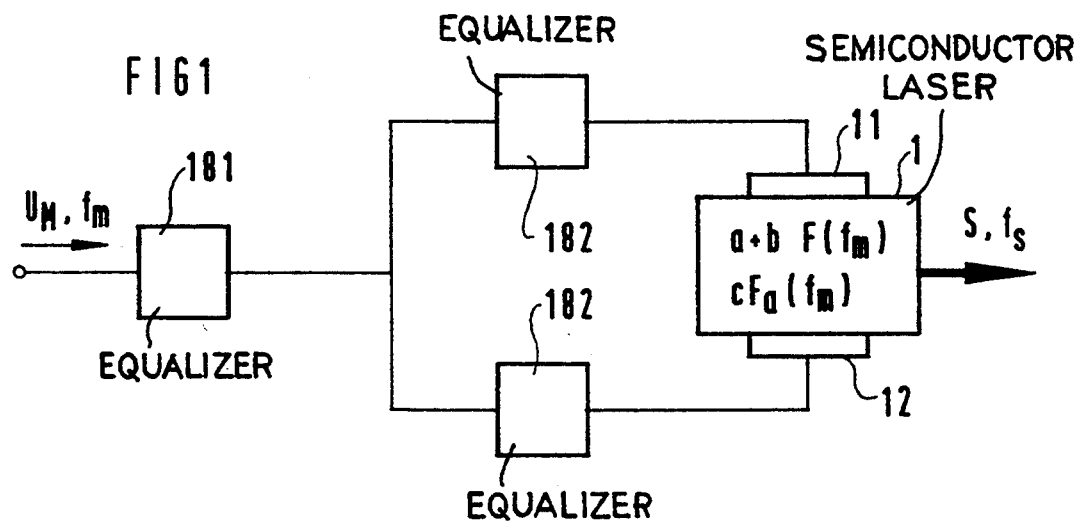
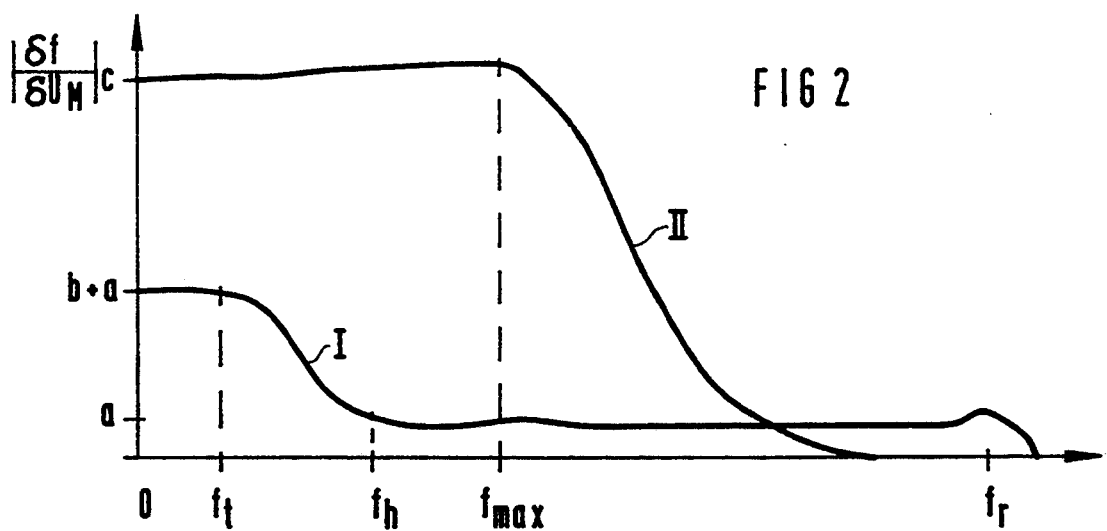
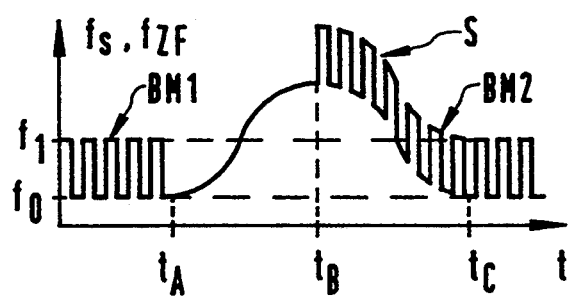
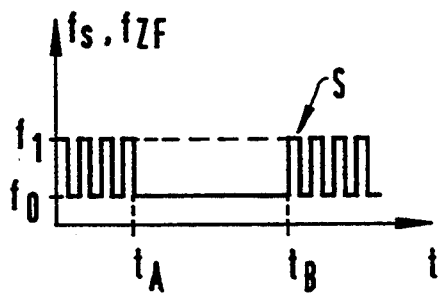

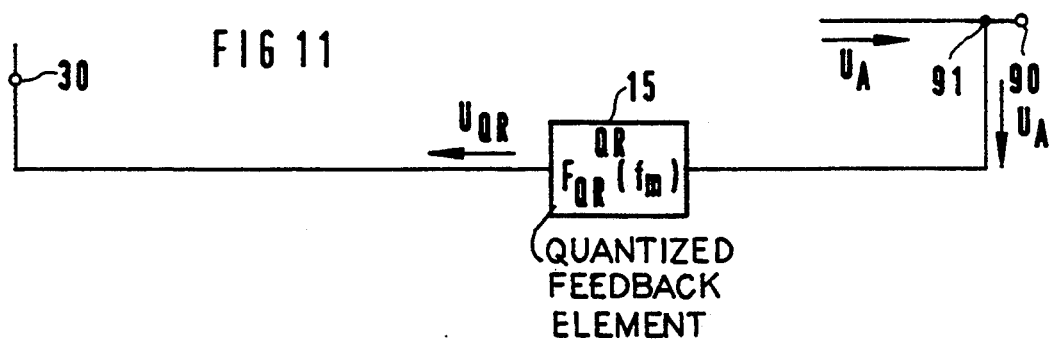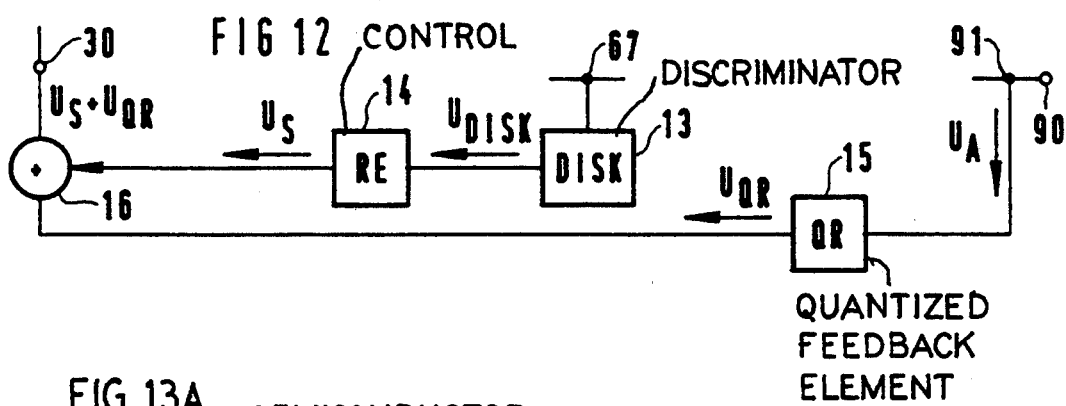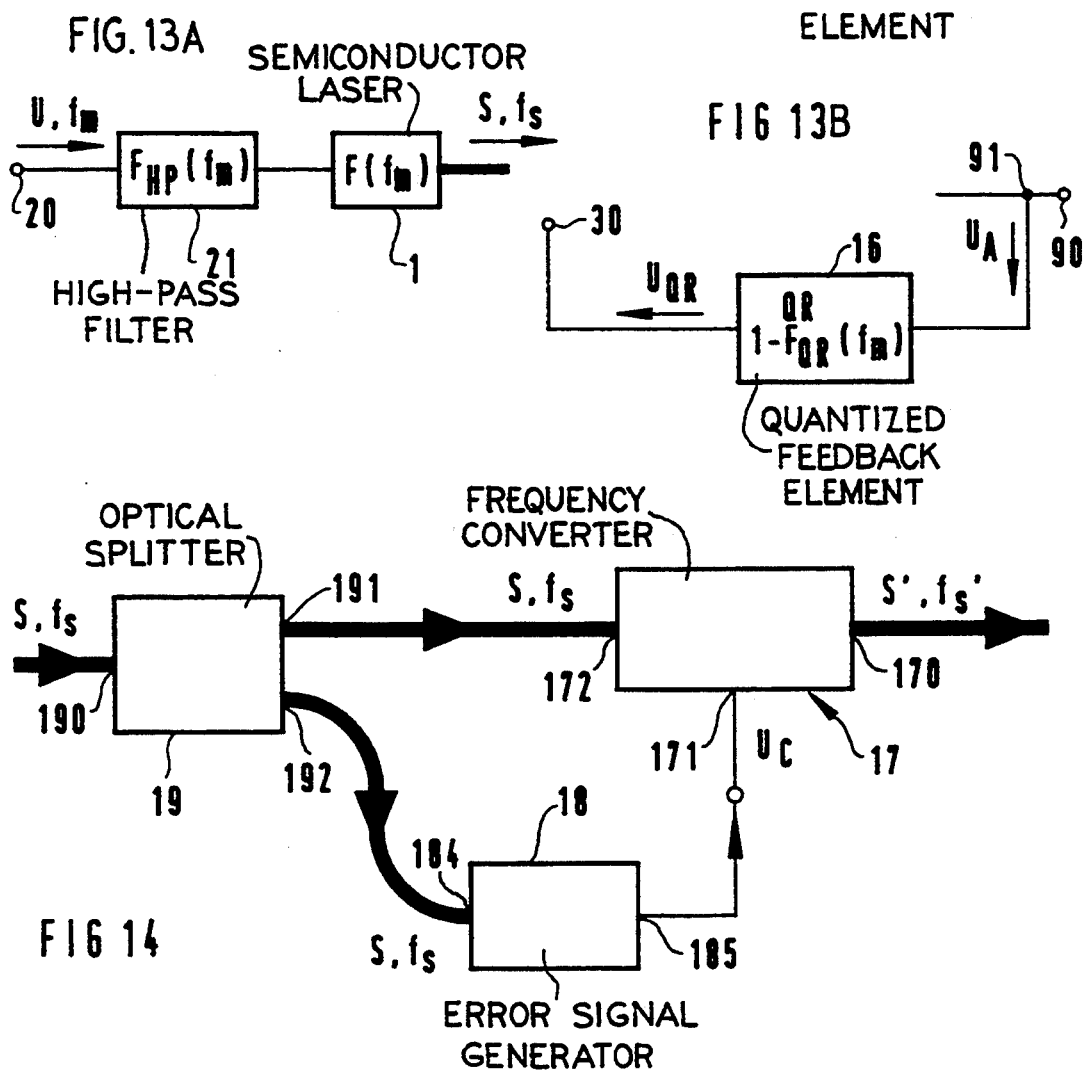

– 1 –

METHOD FOR GENERATING A DISTORTION-FREE, FREQUENCY-MODULATED OPTICAL SIGNAL AND APPARATUS FOR THE IMPLEMENTATION OF SUCH A METHOD

BACKGROUND OF THE INVENTION

The present invention is directed to a method for generating a distortion-free, frequency-modulated optical signal and to apparatus for the implementation of such a method.

In optical heterodyne reception, an optical reference signal having a defined reference frequency in the form of unmodulated light of a local oscillator laser is added in the receiver to a modulated, optical signal generated by an optical transmission laser in the form of modulated light of this transmission laser. Compared to direct reception, higher sensitivity and higher selectivity are simultaneously obtained for the selection of a plurality of offered transmission channels in heterodyne reception.

Binary frequency shift keying (FSK) has proven to be an especially promising modulation method, since the semiconductor lasers employed as signal transmitters can be frequency-modulated in a simple manner by varying the current. Ideally, the achieved frequency shift should be independent of the modulation frequency. This, however, is not normally the case. In particular, sequences that are composed of many identical signals cannot be transmitted distortion-free. Despite a high reception power, the bit error rate frequently cannot be decreased below the value $10^{-5}$ (bit error rate floor).

Known prior art approaches to alleviate this situation are:

Manchester coding (see R. Noe et al., Electronics Letters 25 (1989) 12, pages 757–758) that, due to the doubling of the modulation rate, is not suitable for high bit rates, the same applying to sub-carrier methods;

Alternate mark inversion or AMI coding (see R. Noe et al., Journal of Optical Communications 10 (1989) 3, pages 82–84) that yields lower sensitivity in comparison to normal frequency shift keying;

Bipolar coding (see R. S. Vodhanel, B. Enning, Electronics Letters 24 (1988) 3, pages 163–165), to which the same reason applies as to the AMI coding; and Quantized feedback from the discriminator to the baseband signal (see B. Enning, R. S. Vodhanel, Electronics Letters 24 (1988) 7, pages 397–399). Given this quantized feedback, characteristic frequency values of the frequency shift keying must not lie in the maximums of an output signal of a frequency discriminator but must lie therebetween so that they can compensate modulation distortions. However, it is known that a sub-optimum, reduced receiver sensitivity results when the characteristic frequency values do not lie in the maximums but therebetween.

SUMMARY OF THE INVENTION

It is an object of the present invention to provide a simple method for generating a distortion-free, frequency-modulated optical signal that is suitable for semiconductor lasers as signal transmitters and whereby sensitivity losses are avoided.

According to the present invention, the modulating voltage that drives the semiconductor laser and/or the distorted, frequency-modulating optical signal itself and/or the distortion contained in a heterodyne signal composed of the frequency-modulated optical signal and an optical reference signal are or is subjected to a distortion that compensates the thermally caused distortion for distortion-correction of the frequency-modulated optical signal distorted by the thermal low-pass part of the semiconductor laser.

In general terms the method of the present invention is a method for generating a frequency-modulated optical signal, particularly for optical communications technology, by pumping a semiconductor laser with an electrical voltage that is applied to a pump electrode of this laser and that modulates with a modulation frequency. The semiconductor laser has a frequency transfer function with a thermal low-pass part that is dependent on the modulation frequency. The low-pass part effects a distortion of the generated, frequency-modulated optical signal. For generating a frequency-modulated signal that is entirely or partially free of the distortion caused by the thermal low-pass part, the inventive method has the following:

a semiconductor laser is employed that, in addition to having the pump electrode, has a further electrode for applying the modulating voltage whereby the modulating voltage applied to the pump electrode and the modulating voltage applied to the further electrode are distorted such that the distorted, modulating voltages together entirely or partially compensate the distortion of the frequency-modulated optical signal; and/or the frequency-modulated optical signal itself is subjected to a distortion that entirely or partially compensates a distortion of this signal with reference to a signal frequency of this signal; and/or a frequency-modulated, optical superposition signal is generated by superimposing the frequency-modulated optical signal with an optical reference signal having a specific, modulatable reference frequency and the reference signal is subjected to a distortion with reference to the reference frequency that entirely or partially compensates a distortion of the frequency-modulated optical signal contained in the superposition signal.

Advantageous developments of the present invention are as follows.

A semiconductor laser is employed whose frequency transfer function with reference to the modulating voltage applied to the pump electrode is at least approximately a linear function of the thermal low-pass part.

In a first alternative embodiment, the linear function of the thermal low-pass part has a proportionality factor of the thermal low-pass part and an additive constant. The additive constant and the sum of this additive constant and the proportionality factor of the thermal low-pass part are respective positive numerical values. Both the modulating voltage to be supplied to the pump electrode, as well as, to the further electrode is respectively distorted with a filter, such that the distortion of the frequency-modulated optical signal is entirely or partially compensated.

In a second alternative embodiment the linear function of the thermal low-pass part has a proportionality factor for the thermal low-pass part and an additive constant. The additive constant and the sum of this additive constant and the proportionality factor of the thermal low-pass part are respectively negative numerical values. At least the modulating voltage to be supplied to the pump electrode is distorted with at least one filter such that the distortion of the frequency-modulated signal is entirely or partially compensated.

The laser, with reference to the modulating voltage applied to the further electrode, has a transfer function dependent on the modulation frequency that is equal to a low-pass transfer function multiplied by a specific proportionality constant referred to the further electrode. The low-pass transfer function has the value one for low modulation frequencies and has the value zero for extremely high modulation frequencies.

The modulating voltage is supplied to the pump electrode high-pass filtered and is supplied to the further electrode low-pass filtered.

A TTG laser is employed as the semiconductor laser.

Frequency ranges of the modulation frequency have substantially a flat curve wherein: the magnitude of modulation sensitivity referred to the pump electrode that is established by the relationship, dependent on the modulation frequency, between a change of the signal frequency of the frequency-modulated optical signal and a change of the modulating voltage to be applied to the pump electrode; and/or the magnitude of a modulation sensitivity referred to the further electrode which is established by the relationship, dependent on the modulation frequency, between a change of the signal frequency of the frequency-modulated optical signal and a change of the modulating voltage to be applied to the further electrode that causes this change. This covers the entire range between a lowest first frequency and a second frequency that is higher in comparison to this first frequency. A semiconductor laser is employed here, whereby the magnitude of the modulation sensitivity referred to the pump electrode has a substantially flat curve at least in a frequency range between a defined, third frequency of the modulation frequency that is higher in comparison to the first frequency and lower in comparison to the second frequency, as well as, for modulation frequencies that are higher than a defined, fourth frequency that is higher in comparison to the third frequency. Also, the amount magnitude of the modulation sensitivity referred to the further electrode has a substantially flat curve at least in a frequency range between the first frequency and a fifth frequency of the modulation frequency that is higher in comparison to the fourth frequency.

In a third alternative method an electrical error signal is generated from the frequency-modulated optical signal output by the semiconductor laser, the electrical error signal being at least approximately proportional with a specific proportionality constant to the thermal low-pass part of the frequency transfer function of the semiconductor laser and to the modulating voltage. A controllable frequency converter is controlled with this error signal, the controllable frequency converter effecting a frequency shift of the signal frequency of the frequency-modulated optical signal. The proportionality constant of the error signal is selected such that the optical frequency of an optical output signal at an output of the frequency converter is essentially proportional to the modulated voltage and is not dependent on the thermal low-pass part of the frequency transfer function of the semiconductor laser.

In a fourth alternative method an amplitude signal that is dependent on an intermediate frequency for an intermediate frequency signal acquired from the superimposed signal is generated such that the amplitude signal with reference to a specific amplitude level has at least two level crossings with slopes inclined in a same direction at two specific characteristic frequency values of the intermediate frequency that differ from one another. In the ideal case where the frequency-modulated optical signal output by the semiconductor laser is undistorted, intermediate frequency values occur that are equal to these characteristic frequency values. Given a frequency-related deviation of the intermediate frequency values from the characteristic frequency values, the intermediate frequency values are in turn at least approximately adjusted back to the characteristic frequency values by a change of the reference frequency of the reference signal that is effected by an output signal generated from a constantly identified amplitude level of the amplitude signal.

In a fifth alternative method a signal that corresponds to the modulating voltage is derived from an intermediate frequency signal acquired from the optical superimposed signal. The derived signal is distorted with a low-pass filter part of the frequency transfer function that is dependent on the modulation frequency that is at least approximately equal to a transfer function of the semiconductor laser that is dependent on the modulation frequency. This distorted signal is employed for generating a frequency modulation impressed on the reference signal for the complete or partial compensation of the distortion of the frequency-modulated optical signal that is contained in the intermediate frequency signal.

In regards to each of the fourth and fifth alternative methods the signal dependent on the intermediate frequency is continuously checked to determine whether, at these characteristic frequency values, a deviation of the actual amplitude level of this signal from the specific amplitude level and, thus a deviation of the intermediate frequency values from the characteristic frequency values is present. An optical signal that is dependent on such a deviation is generated. This output signal and the distorted signal superimposed on one another are employed to produce a change of the reference frequency of the reference signal for the complete or partial compensation of the distortion of the frequency-modulated optical signal that is contained in the super-imposition signal.

In a sixth alternative method a signal that corresponds to the modulating voltage is derived from an intermediate frequency signal acquired from the superimposition signal. The modulating voltage is supplied to the semiconductor laser pre-distorted by a high-pass transfer function for the modulation frequency. The derived signal is distorted by a low-pass transfer function of the modulation frequency that is at least approximately complementary to the high-pass transfer function. This distorted signal is employed for generating a frequency modulation impressed on the reference signal for the complete or partial compensation of a distortion of the frequency-modulated optical signal that is contained in the superimposition signal.

An apparatus for the implementation of the first and second alternative methods has the following elements. A high-pass filter means is provided for the high-pass filtering of the modulating voltage to be supplied to the pump electrode of the semiconductor laser. A low-pass filter means is provided for the low-pass filtering of the modulating voltage to be supplied to the further electrode of the semiconductor laser. The low-pass filter means has a predetermined low-pass transfer function for the modulation frequency that essentially assumes the value one for modulation frequencies that are extremely low in comparison to a sixth frequency and essentially assumes the value zero for modulation frequencies that are extremely high in comparison to the sixth frequency. The high-pass transfer function of the high-pass filter means is equal to the value one minus the low-pass transfer function of the low-pass filter means. The sixth frequency lies between the fourth frequency and the fifth frequency.

An apparatus for the implementation of the third alternative method has the following elements. A multiplication means precedes or follows the low-pass filter means for multiplying the unfiltered, modulating voltage or the modulating voltage filtered by this low-pass filter means by a first factor that is equal to the additive constant of the frequency transfer function (in the form of the linear function of the thermal low-pass part of this frequency transfer function) divided by the specific proportionality constant referred to the further electrode. Alternatively, the multiplication means precedes or follows the high-pass filter means for multiplying the unfiltered, modulating voltage or the modulating voltage filtered by this high-pass filter means with a second factor that is equal to the specific proportionality constant referred to the further electrode divided by the additive constant of the frequency transfer function in the form of the linear function of the thermal low-pass part of this frequency transfer function.

The high-pass filter means has a first capacitor connected into a signal path for the modulating voltage that leads to the pump electrode of the semiconductor laser and has a first resistor connected between this signal path and a reference potential. The low-pass filter means has a second resistor connected into a signal path for the modulating voltage that leads to the further electrode of the semiconductor laser and has a second capacitor connected between the second signal path and a reference potential. Alternatively, the low-pass filter means has an inductance connected in a signal path for the modulating voltage that leads to the further electrode of the semiconductor laser and has a third resistor connected between this signal path and the reference potential.

A capacitance of the first capacitor and a value of resistance of the first resistor of the high-pass filter means, as well as, a value of resistance of the second resistor and a capacitance of the second capacitor of the low-pass filter means are selected such that a product of the high-pass filter means formed of the capacitance of the first capacitor and the value of resistance of the first resistor is equal to a product formed from the value of resistance and from the capacitance of the low-pass filter means.

A capacitance of the first capacitor and a value of resistance of the first resistor of the high-pass filter means, as well as, an inductance of the inductor and a value of resistance of the third resistor of the low-pass filter means are selected such that a product formed of the capacitance and the value of resistance of the high-pass filter means is equal to a quotient for the inductance of the low-pass filter means divided by the value of resistance of the third resistor.

An apparatus for the implementation of the fourth alternative method has the following elements.

A frequency discriminator is provided for generating the amplitude signal that is dependent on the intermediate frequency from the intermediate frequency signal. A control means, whereby a continuously identified amplitude level of the amplitude signal is used as an actual value and the specific amplitude level is used as a rated value, generates an output signal that is dependent on a deviation of this actual value from this rated value and that is supplied as a control signal to a frequency-modulatable, optical reference signal transmitter. the signal transmitter generates the reference signal for the purpose of a change of the reference frequency of the reference signal such that the deviation of the actual value from the rated value is at least approximately eliminated.

A frequency-modulatable, optical reference signal transmitter generates the reference signal and has a frequency modulation characteristic that is at least approximately constant over a modulation frequency range provided for the frequency-modulated optical signal. In one embodiment the frequency-modulatable reference signal transmitter that generates the reference signal is a tunable TTG laser.

An apparatus for the implementation of the fifth alternative method has the following elements. A first means generates an optical superimposition signal by superimposition of the frequency-modulated optical signal output by the semiconductor laser and the reference signal that is generated by an optical reference semiconductor laser and has the specific reference frequency. A second means generates an electrical intermediate frequency signal from the optical superimposition signal. A third means generates the derived signal that at least approximately corresponds to the modulating voltage from the intermediate frequency signal. A fourth means is provided for the quantized feedback of the derived signal to the reference signal transmitter that generates the reference signal and for distorting the derived signal with the transfer function that is at least approximately equal to the low-pass part of the frequency transfer function of the semiconductor laser. The reference signal transmitter is an optical transmitter that can be frequency-modulated by the distorted derived signal from the means for quantized feedback.

Furthermore, an adder or subtractor means is provided for superimposing the output signal that is dependent on a deviation of the actual value from the rated value and the distorted derived signal and for supplying these signals superimposed on one another to the frequency-modulatable reference signal transmitter.

An apparatus for the implementation of the sixth method has the following elements. A high-pass filter means has the specific high-pass transfer function for the high-pass filtering of the modulating voltage to be applied to the pump electrode of the semiconductor laser. A first means is provided for generating an optical superimposition signal by superimposing the frequency-modulated optical signal output by the semiconductor laser and the optical reference signal that is generated by an optical reference signal transmitter and has the specific reference frequency. A second means generates a derived signal that at least approximately corresponds to the modulation signal from the optical superimposition signal. A third means is provided for the quantized feedback of the derived signal to the reference semiconductor laser that generates the reference signal and for distorting the derived signal with the low-pass transfer function that is at least approximately complementary to the high-pass transfer function. The reference semiconductor laser is an optical transmitter than can be frequency-modulated by the distorted derived signal.

An alternative apparatus for the implementation of the third alternative method has the following elements. An optical splitter divides the frequency-modulated optical signal into two signal parts. A controllable frequency converter is provided to which one of the two signal parts is supplied and that undertakes a frequency conversion at the supplied signal part dependent on a supplied control signal. An error signal generator is provided to which the other signal part is supplied and which, dependent on this signal part, generates an error signal that is supplied to the frequency converter as a control signal.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several FIGS. of which like reference numerals identify like elements, and in which:

FIG. 1 is a schematic illustration of an exemplary embodiment of an apparatus of the present invention for distortion-correction of the thermally caused, distorted, frequency-modulated optical signal by distorting the modulating voltage with filters in the form of passive equalizers;

FIG. 2 is a graph illustrating the amount $|\delta f/\delta u_M|$ of the modulation sensitivity $\delta f/\delta u_M$ for the pump electrode and the further electrode of the laser dependent on the modulation frequency $f_m$;

FIG. 3a is a graph depicting a typical chronological behavior of the signal frequency $f_s$ of a frequency-modulated, binary optical signal output by the semiconductor laser for that case wherein a longer bit sequence of only one binary value appears between two bit patterns having changing binary values; FIG. 3b is a graph depicting the desired, ideal behavior of the frequency-modulated optical signal assumed in FIG. 2a that is to be achieved;

FIG. 11 is a schematic illustration of a second exemplary embodiment of an apparatus for the distortion-correction of the thermally caused, distorted, frequency-modulated optical signal by distortion of the frequency-modulated optical signal itself using a reference signal superimposed on this signal;

FIG. 12 is a schematic illustration of a third exemplary embodiment of an apparatus for the distortion-correction of the distorted, frequency-modulated optical signal which corresponds to a combination of the exemplary embodiments of FIGS. 7 and 10;

FIG. 13a, b is a schematic illustration of an exemplary embodiment of an apparatus for the distortion-correction of the thermally caused, distorted, frequency-modulated optical signal by distortion both of the modulation signal as well as of the frequency-modulated signal itself; and FIG. 14 is a schematic illustration of a further exemplary embodiment of an apparatus for the distortion-correction of the thermally caused, distorted, frequency-modulated optical signal by distortion of the frequency-modulated signal, whereby a frequency converter is used for distortion-correction.

DESCRIPTION OF THE PREFERRED EMBODIMENT

Figure 4:
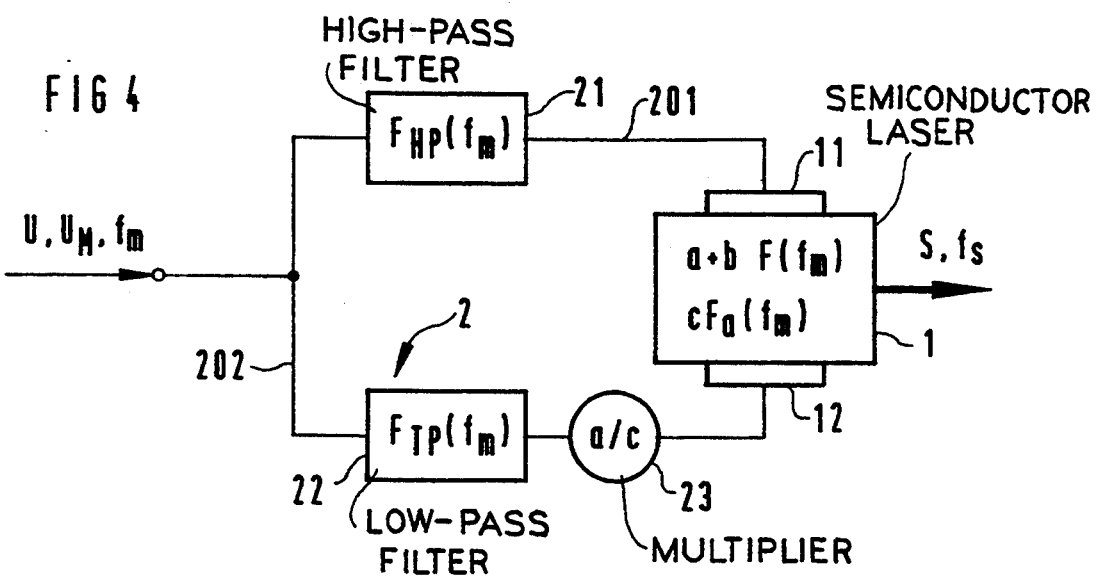
FIG. 4 is a schematic illustration of an exemplary embodiment of an apparatus of the present invention for distortion-correction of the thermally caused, distorted, frequency-modulated optical signal by distortion of the modulating voltage with high-pass and low-pass filters.

For distinguishing electrical signal paths or lines from optical signal paths or lines, the optical signal paths and lines are shown bold face in the figures.

As depicted in the figures, a semiconductor laser 1 has a pump electrode 11 and a further electrode 12. The laser 1 is pumped by a modulating electrical voltage $u_M$ having a modulation frequency $f_m$ that is applied to the electrode 11. The laser 1 outputs a frequency-modulated optical signal S having a modulated signal frequency $f_s$ dependent on the modulating voltage $u_M$.

When the modulating voltage $u_M$ is directly applied to the pump electrode 11, then the frequency-modulated optical signal S, which is output by the laser 1 in the form of laser emission beamed out from the laser 1, is distorted in comparison to the driving, modulating voltage $u_M$. The reason for this is that the modulation sensitivity $\delta f/\delta u_M$, which is established by the relationship between a change $\delta f$ of the signal frequency $f_s$ of the frequency-modulated optical signal S and a change $\delta u_M$ of the modulating voltage $u_M$ that is applied to the pump electrode 11 that is dependent on the modulation frequency $f_m$, is a linear function $a+bF(f_m)$ of a thermal low-pass part $F(f_m)$ of the frequency transfer function of the semiconductor laser 1 for at least a first approximation, whereby the term a denotes an additive constant and the term b denotes a proportionality factor of the thermal low-pass part $F(f_m)$. The terms a and b are generally complex numbers that can also have values on the real number axis wherein the imaginary part is zero.

In the following description it is adequate to consider only such values.

An explanation of this phenomenon can be provided as follows, whereby it is assumed by way of example for a simplified presentation but without limitation of general applications that the modulation voltage $u_M$ generates a modulation current $i_M = u_M/50$ Ohms in the laser 1.

When the pump current of a semiconductor laser is increased, the carrier density in the active zone of this laser also typically increases, as does the refractive index of the laser. This leads to a frequency change in the laser emission beamed out from the laser by a value of the additive constant a of, for example, approximately (50 through 300 MHz/mA)/50 Ohms. Changes of this characteristic in the proximity of the laser relaxation frequency are of no significance for the present invention.

Due to the current boost, however, the dissipated power of the laser also increases, as a result whereof the temperature gradually rises. The frequency of the emitted laser emission thereby also changes. After reaching a final temperature, it has changed by approximately a value of the proportionality factor b that amounts to ($-1000$ MHz/mA)/50 Ohms. As already mentioned, $$\delta f/\delta u_M = a + bF(f_m),$$

is then valid for the modulation sensitivity $\delta f/\delta u_M$. Furthermore, what is valid for the low-pass transfer function $F(f_m)$ caused by the signal transmitter is that it essentially assumes the value one for low modulation frequencies $f_m$ of the modulating voltage $u_M$ that are lower than a defined, third frequency $f_t$ lying between a lowest, first frequency zero and a defined, second frequency $f_r$ (relaxation frequency of the laser) and at least essentially assumes the value zero for high modulation frequencies $f_m$ that are higher than a fourth frequency $f_h$ that is defined higher in comparison to the third frequency $f_t$. For example, the thermally caused low-pass transfer function $F(f_m)$ for fourth frequencies $f_h$ from approximately 100 kHz through approximately 10 MHz no longer significantly differ from zero.

Qualitatively, curve I in FIG. 2 shows the amount $|\delta f/\delta u_M|$ of the modulation sensitivity $\delta f/\delta u_M$ with reference to the pump electrode 11 and curve II qualitatively shows this amount $|\delta f/\delta u_M|$ with reference to the further electrode 12 of an exemplary semiconductor laser 1 dependent on the modulation frequency $f_m$.

The curve I proceeds flatly between the first frequency zero and the third frequency $f_t$ and has approximately the value $a+b$ thereat. In the region between the third frequency $f_t$ and the fourth frequency $f_h$, it drops to approximately the value a and again proceeds flatly between the fourth frequency $f_h$ and the comparatively far higher second frequency $f_r$.

The curve II proceeds flatly between the first frequency zero and the fifth frequency $f_{max}$ that is higher in comparison to the fourth frequency $f_h$ and has approximately the value thereat of the proportionality constant c referred to the further electrode 12. It essentially decreases to the value zero in the range between the fifth frequency $f_{max}$ and the higher, second frequency $f_r$.

Since $f_{max} > f_h$ applies, there are two overlapping regions with flat curve or frequency response. One of these regions lies between 0 and $f_t$ and the other lies between $f_h$ and $f_{max}$.

These two overlap regions can be combined by:

1) modulation both of the pump electrode 11 as well as of the further electrode 12 of the semiconductor laser 1, and
2) modulation of the pump electrode 11 of the laser 1 and of an electrode of a reference signal transmitter whose frequency response is flat from 0 through $f_{max}$.

The modulation according to 2) can be undertaken using a reference signal transmitter via a quantized feedback and/or an automatic frequency control that influences an intermediate frequency signal ZF, or can be undertaken using a frequency converter that influences the frequency of an optical signal acquired by frequency conversion of the frequency-modulated optical signal.

For values $a+b>0$ given positive value a and values $a+b<0$ given negative a, the low-pass transfer function $F(f_m)$ can be compensated with a simple passive equalizer which, for example, can be composed of resistors and capacitors. It is compensated such that the modulation sensitivity $\delta f/\delta u_M$ is a constant independent of the modulation frequency $f_m$. This, however, is generally not the case.

FIG. 3a shows a typical chronological behavior of the signal frequency $f_s$ of a binary, frequency modulated optical signal S output by the signal transmitter 1 for that case wherein a longer bit sequence of only one binary value appears between two binary patterns BM1, BM2 having various, for example alternating binary values. Let it thereby be assumed that one binary value is defined by the frequency $f_0$ and the other binary value is defined by a frequency $f_1$ of the signal S that differs therefrom. Let the longer bit sequence of the only one binary value, for example the binary value of the frequency $f_0$, begin after the bit pattern BM1 at time $t_A$ and end with the beginning of the next bit pattern BM2 at time $t_B$.

As may be derived from FIG. 3a, the signal frequency $f_s$ after the time $t_A$ does not remain at the frequency of the only one binary value of the longer bit sequence, i.e. at the frequency $f_0$ in the example, but also chronologically changes. Only with the commencement of the next bit pattern BM2 at time $t_B$ do the modified frequencies corresponding to the two binary values gradually return to their original values $f_0$ and $f_1$ that are reached at approximately time $t_C$.

FIG. 3b, by contrast, shows the desired, ideal behavior of the frequency-modulated optical signal S assumed in FIG. 2a that should more or less achieved according to the circumstances. The signal frequency $f_s$ according to FIG. 2b also remains constant during the longer bit sequence of the only one binary value, remaining constant at the frequency corresponding to this binary value, the frequency $f_0$ in the example. What is to be understood by "distortion-free, frequency-modulating signal" as used above, is every frequency-modulating signal S that is improved in the direction to the undistorted signal S of the ideal case or reaches this ideal case in comparison to a signal S, for example S of FIG. 2a, that is generated distorted by the signal transmitter 1.

The ideal behavior of the frequency-modulated optical signal S is entirely or at least approximately inventively achieved by a distortion-correction of this signal S on the basis of a distortion of the modulating voltage $u_M$ and/or of a distortion of the optical signal S frequency-modulated by the semiconductor laser 1.

In the exemplary embodiment of FIG. 1, the frequency-modulated optical signal S is distortion-corrected by distortion of the modulating voltage $u_M$ with passive equalizers, whereby either $a+b>0$ and $a>0$ of $a+b<0$ and $a<0$ is assumed.

In this exemplary embodiment, both the modulating voltage $u_M$ to be supplied to the pump electrode 11 as well as to be supplied to the further electrode 12 is distorted such with equalizers 181, 182 and 183 (which can also attenuate) such that the distortion of the frequency-modulated optical signal S is entirely or partially compensated, i.e. such that the modulation sensitivity $\delta f/\delta u_M$ is at least approximately constant.

Three equalizers 181, 182 and 183 are provided in the example of FIG. 1, the preceding equalizer 181 thereof being allocated in common to the pump electrode 11 and the further electrode 12. The equalizer 182 is only allocated to the pump electrode 11 and the equalizer 183 is only allocated to the further electrode 12. In general, either the equalizer 181 or the equalizer 182 can be omitted.

In the exemplary embodiment of FIG. 4, a semiconductor laser 1 is employed whose thermal low-pass transfer function $F(f_m)$ (as already mentioned) essentially assumes the value one for low modulation frequency $f_m$ of the frequency-modulated optical signal S that are lower than the defined third frequency $f_t$ and at least essentially assumes the value zero for high modulation frequencies $f_m$ that are higher than the defined fourth frequency $f_h$ which is higher in comparison to the third frequency $f_t$.

The further electrode 12 of this semiconductor laser 1 is arranged and/or fashioned such that, given an application of the modulating voltage $u_M$ to the further electrode 12, the modulation sensitivity $\delta f/\delta u_M$ referred to this further electrode is at least approximately $$\delta f/\delta u_M = cF_a(f_m).$$

The term c denotes the defined proportionality constant referred to the further electrode 12 and $F_a(f_m)$ denotes a further, laser-conditioned low-pass transfer function for the modulation frequency $f_m$ referred to this electrode. The further, laser-conditioned low-pass transfer function $F_a(f_m)$ essentially assumes the value one for modulation frequencies $f_m$ that are lower than or equal to the fifth frequency $f_{max}$ which is higher than the fourth frequency $f_h$, so that the curve II of FIG. 2 qualitatively derives for $|\delta f/\delta u_M|$.

These properties apply to semiconductor lasers 1 that, in addition to having the electrode 11 for pumping, also have at least one further electrode 12 in the form of a tuning electrode. For such lasers, the proportionality constant c has a value of approximately ($-100$ through $+100$ GHz/mA)/50 Ohms. At the same time, $f_{max}$ is normally lower than half the bit rate of the modulation signal U, so that a direct modulation via the tuning electrode is not adequate. The proportionality constant c is approximately 3 through 10 GHz/mA/50 Ohms and $f_{max}$ is greater than 100 MHz for TTG lasers (see K. Droegemueller, S. Illek, Proc. ECOC 90, Amsterdam, The Netherlands, pages 181–184).

According to FIG. 4, a high-pass filter means 21 is provided for high-pass filtering of the modulating voltage $u_M$ supplied to the pump electrode 11 and a low-pass filter means 22 is provided for low-pass filtering of the modulating voltage $U_m$ supplied to the further electrode 12. The low-pass filter means 22 has a predetermined low-pass transfer function $F_{TP}(f_m)$ for the modulation frequency $f_m$ of the frequency-modulated optical signal S that essentially assumes the value one for modulation frequencies $f_m$ that are extremely low in comparison to a defined, sixth frequency $f_g$ lying between the fourth frequency $f_h$ and the fifth frequency $f_{max}$. The high-pass transfer function $F_{HP}(f_m)$ of the high-pass filter means 21 is equal to $1-f_{TP}(f_m)$ and this high-pass transfer function $F_{HP}(f_m)$ at least essentially assumes the value one for modulation frequencies $f_m$ that are high in comparison to the sixth frequency $f_g$.

Figure 5A:
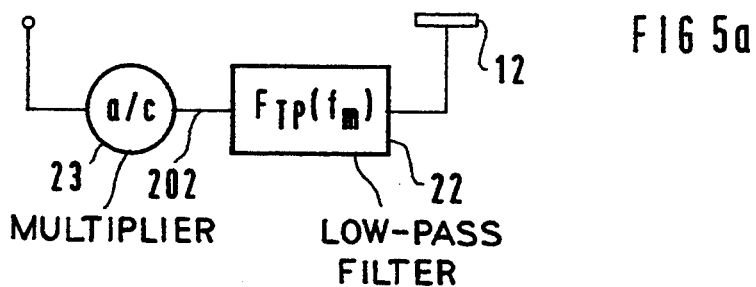
FIGS. 5a through 5c depict respective alternative portions of the FIG. 1 apparatus showing a modification of the exemplary embodiment of FIG. 1.

It is also expedient when the low-pass filter means 22 is preceded or followed by a multiplication means 23 for multiplying the unfiltered, modulating voltage $u_M$ or the modulating voltage $u_M$ filtered by this low-pass filter means 22 by the factor $a/c$, whereby c is the defined proportionality constant and a is the additive constant of the linear function $a+b(f_m)$. In the exemplary embodiment of FIG. 4, the multiplication means 23 follows the low-pass filter means 22. FIG. 5a shows that case wherein the multiplication means 23 precedes the low-pass filter means 22.

Figure 5B:
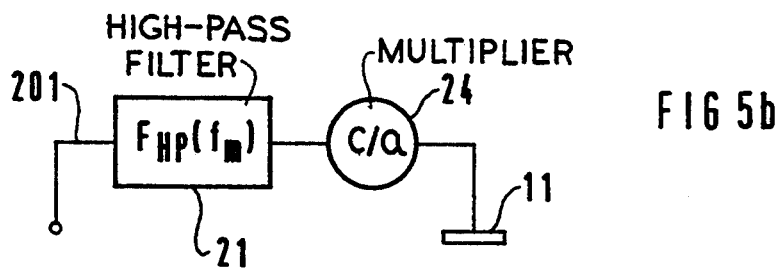

Alternatively thereto, the high-pass filter means 21 can be preceded or followed by a multiplication means 24 for multiplying the unfiltered modulating voltage $u_M$ or the modulating voltage $u_M$ filtered by the high-pass filter means 21 by the factor $c/a$. FIG. 5b shows that case wherein the multiplication means 24 follows the high-pass filter means 21 and FIG. 5c shows that case wherein the multiplication means 24 precedes the high-pass filter means 21.

Over and above this, it is expedient when the signal running time in the signal path 201 in which the high-pass filter means 21 is arranged and which leads to the electrode 11 for pumping the semiconductor laser 1 is equal to the signal running time in the signal path 202 in which the low-pass filter means 220 is arranged and which leads to the further electrode 12 of the semiconductor laser 1. If necessary, this can be effected by inserting one or more delay elements in the signal path 201 and/or the signal path 202.

Figure 5C:
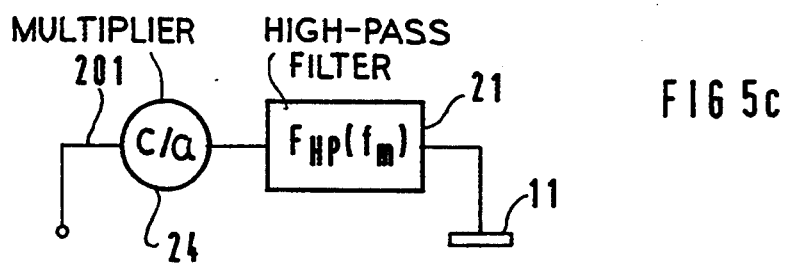

For the embodiments of FIGS. 4 and 5a as well as of FIGS. 5b and 5c, it can be shown under the above-recited conditions for the transfer functions $F(f_m)$, $F_a(f_m)$, $F_{HP}(f_m)$ and $F_{TP}(f_m)$ that the overall modulation sensitivity $\delta f/\delta u_M$ at which all of these transfer functions and, in the case of FIGS. 4 and 5a, the factor $a/c$ and, in the case of FIGS. 5b and 5c, the factor $c/a$ are taken into consideration, is essentially the same $$\delta f/\delta u_M = au_M(f_m),$$

i.e. that this overall modulation sensitivity $\delta f/\delta u_M$ is in fact essentially independent of the modulation frequency $f_m$ and that no distortions of the optical frequency-modulated signal S thus appear in comparison to the modulating voltage.

The methods and the apparatus wherein the modulating voltage is distorted for distortion-correction of the frequency-modulated optical signal generally have the advantage that they are suitable for arbitrary frequency-modulated optical message transmission applications, for example both for optical heterodyne receivers such as homodyne and heterodyne receivers, as well as for other reception methods, for example for direct reception with an optical frequency discriminator. Moreover, there is also generally the advantage that arbitrary receivers can be employed, since the frequency modulation ensues at least approximately in an ideal way. These advantages particularly apply to the exemplary embodiments of the present invention shown in FIGS. 3, 4a through 4c.

Figure 6A:
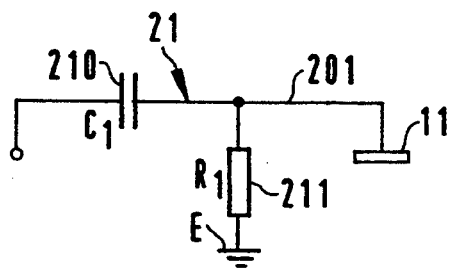
FIGS. 6a and 6b depict circuits of a high-pass filter means and of a low-pass filter means, respectively, of the exemplary embodiment of FIG. 1.

The realization of a high-pass filter means 21 shown in FIG. 6a has a capacitor 210 having a capacitance $C_1$ connected in the signal path 201 for the modulating voltage $u_M$ that leads to the pump electrode 11 of the semiconductor laser 1, and has a resistor 211 having a value of resistance $R_1$ that is connected between this signal path 201 and a reference potential E, for example ground. The capacitance $C_1$ and the value of resistance $R_1$ are dimensioned such that $$f_g = 1/2\pi C_1 R_1,$$

is valid, whereby $f_g$ is the aforementioned, sixth frequency.

Figure 6B:
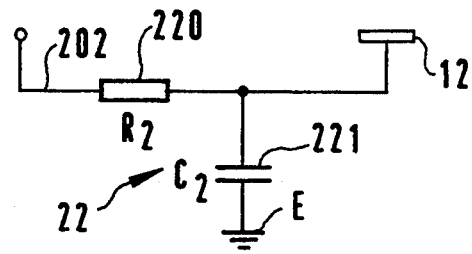

The realization of a low-pass filter means 22 shown in FIG. 6b has a resistor 220 having a value of resistance $R_2$ connected in the signal path 202 for the modulating voltage $u_M$ that leads to the further electrode 12 of the semiconductor laser 1, and has a capacitor 221 having a capacitance $C_2$ that is connected between this signal path 202 and a reference potential E, for example ground. The value of resistance $R_2$ and the capacitance $C_2$ are dimensioned such that $$f_g = 1/2\pi C_2 R_2$$

is valid.

Figure 6C:
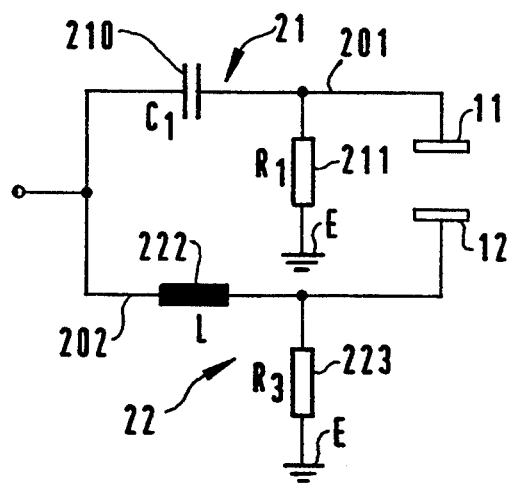
FIG. 6c depicts a circuit realization of the high-pass and low-pass filter means of the exemplary embodiment of FIG. 1.

In the realization of high-pass and low-pass filter means shown in FIG. 6c, the high-pass filter means 21 is composed of the means of FIG. 6a having the capacitor 210 and the resistor 211. The low-pass filter means 22, by contrast, is composed of an inductor 222 having an inductance L that is connected in the signal path 202 for the modulating voltage $u_M$ that leads to the further electrode 12 and of a resistor 223 having a value of resistance $R_3$ that is connected between this signal path 202 and a reference potential E, for example ground. The capacitance $C_1$ of the capacitor 210 connected into the signal path 201 for the modulating voltage $u_M$ that leads to the pump electrode 11 of the semiconductor laser 1 and the value of resistance $R_1$ of the resistor 211 connected between this signal path 201 and the reference potential E in the high-pass filter means 21 as well as the inductance L of the inductor 222 and the value of resistance $R_3$ of the resistor 223 of the low-pass filter means 22 are respectively selected such that $$f_g = 1/2\pi R_1 C_1 = 1/(2\pi R_3/L)$$

is valid. When, moreover, $R_1 = R_3$, then an input impedance for the modulating voltage $u_M$ that is independent of the modulation frequency $f_m$ advantageously derives.

The various exemplary embodiments of a means for distortion-correction of the frequency-modulated optical signal S by manipulation at this signal S itself, that are shown in FIGS. 7 and 11 through 14, assume a semiconductor laser 1 having an input 20 for applying the modulating voltage $u_M$ and the thermal transfer function $F(f_m)$ as well as an optical super heterodyne receiver. The input 20, for example, can be a terminal of the pump electrode 11 of the semiconductor laser 1.

The frequency-modulated optical signal S output by the semiconductor laser 1 with the frequency-modulated signal frequency $f_s$ is supplied, for example, by an optical fiber 41 to an optical coupler means 4 of the receiver. For example, an optical directional coupler in which an optical reference signal RS having a defined reference frequency $f_R$ generated by an optical reference signal transmitter 3, for example a local oscillator of the receiver, is superimposed on the frequency-modulated optical signal. As a result, the two signals superimposed on one another form an intermediate frequency signal ZF having the intermediate frequency $f_{ZF} = f_s - f_R$, whereby this intermediate frequency signal ZF (given the conditions of FIGS. 2a and 2b) behaves chronologically exactly like the frequency-modulating optical signal $f_s$ itself, so that these two FIGS. 2a and 2b are also valid for the intermediate frequency $f_{ZF}$.

The intermediate frequency signal ZF is conducted to a photodetector 5 of the receiver and is converted by this photodetector 5 into an electrical signal that is amplified in an electrical amplifier 6 of the receiver and is available at an output of this amplifier 6 for further-processing into an output signal $U_A$ of the receiver.

Figure 7:
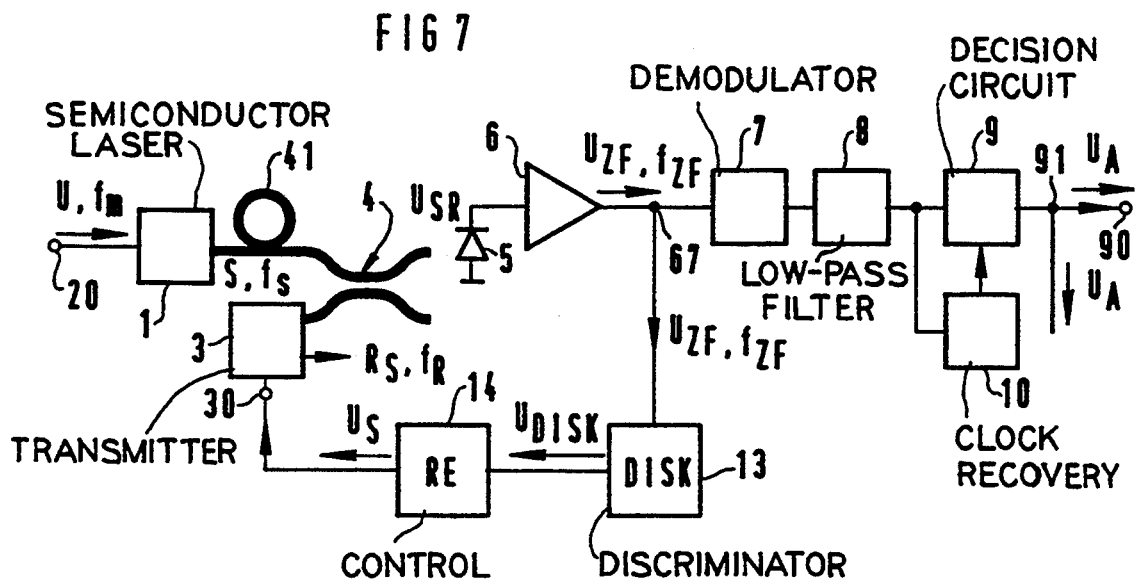
FIG. 7 is a schematic illustration of a first exemplary embodiment of an apparatus for distortion-correction of the thermally caused, distorted, frequency-modulated optical signal by distortion of the frequency-modulated optical signal itself using a reference signal superimposed on this signal.

In the first exemplary embodiment of FIG. 7, this further-processing of the electrical intermediate frequency signal ZF from the electrical amplifier 6 is of no significance. The only thing of concern in this exemplary embodiment is that the electrical intermediate frequency signal ZF having the intermediate frequently $f_{ZF} = f_s - f_R$ can be supplied to a specific frequency discriminator 13 for generating an amplitude signal $U_{DISK}$ from the intermediate frequency signal ZF that is dependent on the intermediate frequency $f_{ZF}$. In the exemplary embodiment of FIG. 7, let the intermediate frequency signal ZF be branched off for this purpose at a point following the amplifier 6.

Figure 8:
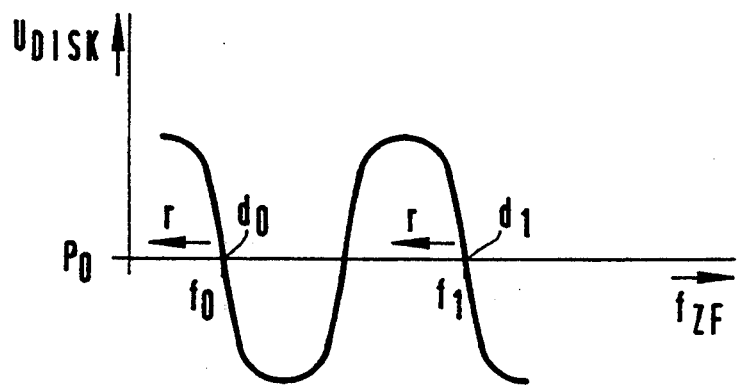
FIG. 8 is a graph of an output voltage of a frequency discriminator used in the exemplary embodiment of FIG. 7 for an intermediate frequency signal generated from the frequency-modulated optical signal by superimposition with the reference signal, dependent on the intermediate frequency of the intermediate frequency signal.

The frequency discriminator 13 is fashioned such that the amplitude signal $U_{DISK}$ generated by it, for example, an output voltage of the frequency discriminator 13 behaves as a function of the intermediate frequency $f_{ZF}$ of the intermediate frequency signal ZF as shown in FIG. 8. According thereto, this amplitude signal $U_{DISK}$ has two level crossings $d_0$ and $d_1$ at two different characteristic frequency values $f_0$ and $f_1$ of the intermediate frequency $f_{ZF}$, these two level crossings $d_0$ and $d_1$ having slopes in the same direction r with reference to a defined amplitude level $P_0$, preferably a zero level. In the ideal case of FIG. 3b wherein the frequency-modulated optical signal S output by the semiconductor laser 1 is undistorted in comparison to the modulating voltage $u_M$, intermediate frequency values occur that are identical to the characteristic frequency values $f_0$, $f_1$. Given a frequency-related deviation of the intermediate frequency values from the characteristic frequency values $f_0$, $f_1$, the intermediate frequency values are at least approximately adjusted back to the characteristic frequency values $f_0$, $f_1$ with a modification of the reference frequency $f_R$ of the reference signal RS effected by an output signal $U_S$ generated from a continuously identified amplitude level P of the amplitude signal $U_{DISK}$. These two characteristic frequency values $f_0$ and $f_1$ preferably have the two binary values of a binary signal allocated to them, i.e. one binary value corresponds to the characteristic frequency value $f_0$ and the other binary value of the digital signal corresponds to the characteristic frequency value $f_1$.

Frequency discriminators that generate an amplitude signal $U_{DISK}$ as shown in FIG. 8 are known (see R. Noe et al., Electronics Letters 25 (1981) 1, pages 4–5 or T. Imai, K. Iwashita, Proc. OOOC '89, Kobe, Japan, Paper 18C2-6). The two level crossings $d_0$ and $d_1$ make it possible to bind the intermediate frequency $f_{ZF}$ to the proper location even during longer sequences of only one binary value.

The amplitude signal $U_{DISK}$ generated by the frequency discriminator 13 is supplied to a control means 14. The control means 14 uses an amplitude level P of the amplitude signal $U_{DISK}$ that is continuously identified and lies at the characteristic frequency values $f_0$ and $f_1$ as an actual value and uses the specific amplitude level $P_0$ as a rated value. The control means 14 generates an output signal $U_S$ dependent on a deviation of this actual value P from this rated value $P_0$ which is supplied as a control signal to the frequency-modulatable optical reference signal transmitter that generates the reference signal $R_S$ in order to modify the reference frequency $f_R$ of the reference signal RS such that the deviation of the actual value P from the rated value $P_0$ is at least approximately cancelled.

A particular advantage of the first exemplary embodiment according to FIGS. 7 and 8 is fast and automatic frequency regulation. Moreover, it is adequate to retune the reference frequency $f_R$ such that the intermediate frequency $f_{ZF}$ at least approximately assumes the ideal curve shown in FIG. 3b. A PI regulator can be typically employed as regulation means.

Let it be pointed out that a control loop that is similar to the frequency control loop of FIG. 7 is already fundamentally known. The frequency discriminators employed in this known control loop, however, usually have a characteristic of the output signal $U_{DEM}$ as a function of the intermediate frequency $f_{ZF}$ as proceeds from FIG. 9. Given this characteristic, the two binary values of a binary signal yield contributions of opposite operational sign that of the same size, whereby the average intermediate frequency $f_{ZF}$ is stabilized to the zero-axis crossing $(f_0+f_1)/2$, as desired. Consequently, during a long sequence of the binary value the frequency belonging to this binary value would be stabilized to this value. The output signal $U_{DEM}$, however, also becomes unusable because it is equal to zero. Relatively low regulator gains, i.e. low regulator band widths were therefore previously selected.

Figure 9:
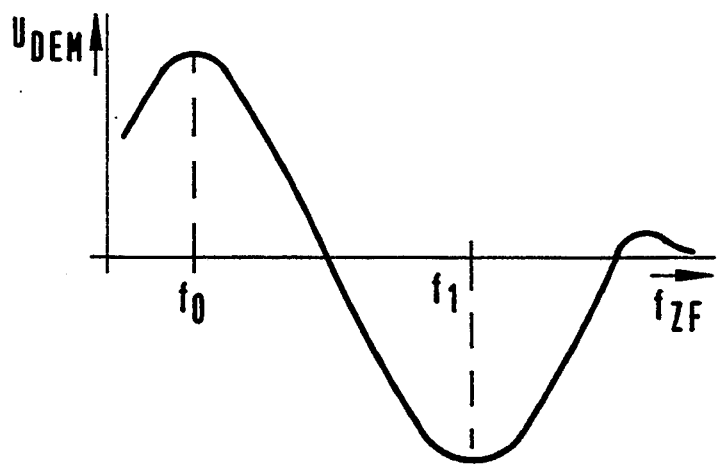
FIG. 9, for comparison to the characteristic of the frequency discriminator of FIG. 8, is a graph depicting an output voltage of a frequency discriminator used for the demodulation of an intermediate frequency signal acquired from the frequency-modulated optical signal by traditional heterodyne reception, dependent on the intermediate frequency of this intermediate frequency signal.
Figure 10:
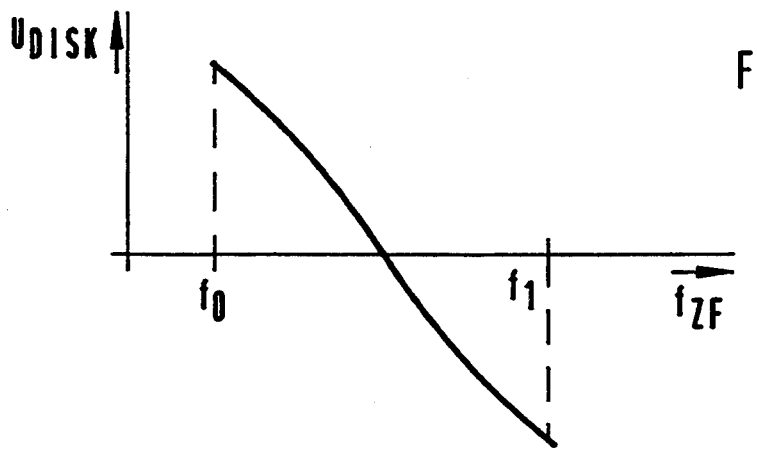
FIG. 10, for comparison to the characteristic of the frequency discriminator according to FIGS. 8 and 9, is a graph depicting an output voltage of another frequency discriminator employed for the demodulation of an intermediate frequency signal acquired from the frequency-modulated optical signal by traditional heterodyne reception, dependent on the intermediate frequency of this intermediate frequency signal.

Whereas a stabilization of the intermediate frequency ZF is not possible with a characteristic according to FIG. 9, a sub-optimum receiver sensitivity would derive, on the other hand, with a modulator having a characteristic of the output signal $U_{DISK}$ as a function of the intermediate frequency $f_{ZF}$ as shown in FIG. 10.

As a result of the level crossings $d_0$ and $d_1$ that have slopes in the same direction r at the characteristic frequency values $f_0$ and $f_1$ that are inventively employed, the regulator bandwidth $f_B$ defined by the regulator gain can be advantageously drastically increased, differing from the prior art. As a result a leveling of the frequency functions of the transmission signal S by the reference signal transmitter 3 is enabled. The frequency modulation characteristic of the reference signal transmitter 3 should thereby be at least approximately constant for modulation frequencies in the range from $0 < f_m < f_{max}$ with $f_{max} > f_B$. The leveling functions completely when $f_B > f_h$ applies. Since this is not possible given standard semiconductor lasers, a tunable TTG laser, for example, should therefore be employed as reference signal transmitter 3, whereby $f_{max}$ can amount to approximately 100 MHz.

In the exemplary embodiment of FIG. 11, the means for generating the signal $u_A$ that is derived from the intermediate frequency signal ZF and at least approximately corresponds to the modulating voltage $u_M$ is also required in addition to the means 3 through 6 for generating the electrical intermediate frequency signal ZF in comparison to the exemplary embodiment of FIG. 7.

This means for generating the derived signal $u_A$ can, for example, be composed of the means for the further-processing of the intermediate frequency signal ZF from the amplifier 6 into the output signal of the super heterodyne receiver which has a demodulator 7 for the demodulation of the intermediate frequency signal ZF, a low-pass filter 8 serving for the elimination of noises for low-pass filtration of the demodulated signal output by the demodulator 7, a decision circuit 9 clocked by the clock of a clock recovery circuit 10 for regenerating the signal output by the low-pass filter 8. The decision circuit 9 outputs the regenerated output signal at an output 90. The clock recovery circuit 10 recovers the clock contained in the supplied signal. In FIG. 7, this supplied signal is the signal from the low-pass filter 8 but could just as easily be the demodulating signal from the demodulator 7 supplied to the low-pass filter 8.

Given this means of FIG. 7, the signal that can be taken at the output 90 of the decision circuit 9 is an extremely exact replica of the modulating voltage $u_M$ at the usually low bit error rates that are less than or equal to $10^{-9}$. Consequently, this output signal can be employed as the signal $u_A$ that is derived from the intermediate frequency signal ZF and that corresponds to the modulating voltage $u_M$. This derived signal $u_A$ is directly taken from the output 90 or, according to FIG. 7, is branched off at a branch point 91 and is supplied to the means 15 shown in FIG. 11 for quantized feedback of this derived signal $u_A$ to the input 30 of the reference signal transmitter 3 that generates the reference signal R and for distorting this derived signal $u_A$ with the transfer function $F_{QR}(f_m)$ that is at least approximately the same as the transfer function $F(f_m)$ of the signal transmitter 1. The reference signal transmitter 3 is thereby an optical transmitter that can be frequency-modulated by the distorted, derived signal $U_{QR}$ from the means 15 for quantized feedback.

The change of the intermediate frequency $f_{ZF}$ caused by the factor b that co-determines the above-defined modulation sensitivity $\delta f/\delta u_M = a + bF(f_m)$ can be largely eliminated in this exemplary embodiment, this being shown below.

Such is valid in the frequency range $$f_S(f_m) = f_{s0} + (a + bF(f_m)) \cdot u_M(f_m)$$

$$f_R = f_{R0} + c_1 F_{QR}(f_m) \cdot u_A(f_m).$$

The frequencies $f_{s0}$ and $f_{R0}$ are average frequencies of the frequency-modulated optical signal S or, respectively, of the optical reference signal that are selected such that the desired average intermediate frequency is $f_{ZF0} = f_{s0} - f_{R0} = (f_0 + f_1)/2$. The term $c_1$ is a proportionality constant deriving from a frequency modulation sensitivity of the modulatable frequency signal transmitter 3 and from a selected primary amplification of the means 15 for quantized feedback. The signal $u_A(f_m)$ is a modulated, derived signal that corresponds to the modulating voltage $u_M$. Upon condition that $F_{QR}(f_m)$ is at least approximately equal to $F(f_m)$ and $u_A$ is at least approximately equal to $u_M$ and that $c_1$ is selected at least approximately equal to b, $$f_{ZF} = f_{s0} - f_{R0} + a \cdot u_M(f_m) = (f_0 + f_1)/2 + a \cdot u_M(f_m),$$

at least approximately derives for the intermediate frequency $f_{ZF}=f_s-f_R$, i.e. the intermediate frequency changes caused by b are eliminated.

The quantized feedback advantageously supplies only deterministic signals and no noise to the reference signal transmitter 3. This method can therefore be used up to rather high frequencies.

The quantized feedback only takes effect after a signal running time $t_0$ in the closed loop from the optical coupling means 4 via the optical receiver having the positions 5 through 9 in FIG. 5, the means 15 for quantized feedback and the reference signal transmitter 3 back to the coupling means 4. In force as a demand is that the term $bF(f_m)$ in the above equation is equalized for $f_s(f_m)$. Since $F(f_m)$ has noteworthy components up to the aforementioned, second frequency $f_h$, $$t_0 < 1/(2\pi f_h)$$

must be at least approximately valid. The time $t_0=16$ ns is valid as an upper limit for $f_h=10$ MHZ and can be realized with reasonable technological outlay.

In order to achieve the ideal behavior of FIG. 3b for the frequency-modulated signal as exactly as possible in the exemplary embodiment of FIG. 11, the transfer function $F(f_m)$ of the signal transmitter 1 must be simulated as exactly as possible. Problems thereby arise in that this transfer function $F(f_m)$ is rather different from transmission laser to transmission laser. The exemplary embodiments of FIGS. 12 and 13 can alleviate this situation.

The exemplary embodiment of FIG. 12 corresponds to a combination of fast frequency regulation according to the exemplary embodiment of FIG. 7 with the quantized feedback according to the exemplary embodiment of FIG. 11. In accord therewith, both the frequency discriminator 13 and the control means 14 of FIG. 7 as well as the means 15 for quantized feedback according to FIG. 11 are present in this exemplary embodiment. The frequency discriminator 13 is supplied with the electrical intermediate frequency ZF branched off at the point 67 and the means 15 is supplied with the derived signal $u_A$ branched off from point 91. Moreover, a mixer means 16 for superimposing the output signal $U_s$ of the control means 14 and the derived signal $U_{QR}$ distorted by the means 15 and for supplying these signals $U_s=U_{QS}$ superimposed on one another to the input 30 of the frequency-modulatable reference signal transmitter 3 is present.

This combination has the advantage that, first, the transfer function $F_{QR}(f_m)$ of the means 15 for quantized feedback need not coincide exactly with the transfer function $F(f_m)$ of the signal transmitter 1 because it is enhanced by the frequency regulation with the frequency discriminator 13 and the control means 14. On the other hand, the bandwidth $f_B$ of the frequency control loop can be kept narrower, since the high-frequency noise parts are leveled by the means 15 for quantized feedback. As a result of the smaller bandwidth $f_B$, less noise proceeds onto the reference frequency generator, this preventing a deterioration of the receiver sensitivity.

In the exemplary embodiment of FIG. 12, the control loop comprising the frequency discriminator 13 and the control means 14 could also be replaced by a conventional frequency regulation that has the discriminator characteristic of FIG. 8 very slowly and/or not at all. Compared to such an embodiment, the exemplary embodiment of FIG. 12 has a greater regulator bandwidth.

The exemplary embodiment of FIG. 13a, b corresponds to a combination of a pre-distortion of the modulating voltage $u_M$ with a specific, quantized feedback. A high-pass filter means 21 having a specific high-pass transfer function $F_{HP}(f_m)$ for high-pass filtration of the modulating voltage $u_M$ is provided for the predistortion of the modulating voltage $u_M$.

A means for generating an intermediate frequency signal ZF by superimposition of the frequency-modulated optical signal S output by the semiconductor laser 1 and of the reference signal generated by an optical reference signal transmitter 3 and having a specific reference frequency $f_R$ is required for the quantized feedback. This means can be realized by the coupling means 4, the photodetector 5 and the amplifier 6 of FIG. 7.

Further, a means for generating a signal $U_A$ that is derived from the intermediate frequency signal ZF and at least approximately corresponds to the modulating voltage $u_M$ is required. This means can be realized by the discriminator 10, the demodulator 8, the decision circuit 9 and the clock recovery circuit 10 of FIG. 7.

The signal $u_A$ derived from the intermediate frequency signal ZF is supplied to a means 16 for quantized feedback of this derived signal $u_A$ to the reference signal transmitter that generates the reference signal R, for example to the input 30 of the reference signal transmitter 3 of FIG. 7. It is provided for distorting the derived signal $u_A$ with the low-pass transfer function $1-F_{HP}(f_m)$ that is complementary to the high-pass transfer function $F_{HP}(f_m)$. The reference signal transmitter must be a frequency-modulatable optical transmitter that can be frequency-modulated by the derived signal $U_{QR}$ distorted by the means 16 for generating the quantized feedback.

In this exemplary embodiment of FIG. 7, the high-pass filter means 21 should advantageously allow essentially only frequencies above the aforementioned, fourth frequency $f_g$ to pass.

Valid in the frequency range is $$f_s(f_m)=f_{s0}+(a+bF(f_m))F_{HP}(f_m)u_M(f_m)$$

$$f_R=f_{R0}+c_1(1-F_{HP}(f_m))u_A(f_m),$$

where $u_A$ is at least approximately equal to $u_M$. When, moreover, $c_1=a$ is selected, then $$f_{ZF}=f_{s0}-f_{R0}+(a+b(f_m)F_{HP}(f_m))u_M(f_m)$$

derives for the intermediate frequency $f_{ZF}=f_s-f_R$.

When, further, the fourth frequency $f_g$ is selected higher than the second frequency $f_h$, then $F(f_m)$ and $F_{HP}(f_m)$ have no overlap or only a negligibly small overlap, and $$f_{ZF}=f_{s0}-f_{R0}+au_M(f_m)$$

at least approximately applies, i.e. the intermediate frequency changes caused by b are also eliminated here, so that one is independent of the unknown, thermal laser frequency response, this representing a cost advantage in the laser characterization and in the circuit design of the means 16 for quantized feedback.

The signal running time $t_0$ in the closed loop from the optical coupling means 4 via the optical receiver having the positions 5 through 9 in FIG. 7, the means 16 for quantized feedback and the reference signal generator 3 back to the coupling means 4 is advantageously selected shorter than $1/2\pi f_g$ for eliminating a noise term. So that the reference signal transmitter 3 can implement rapid frequency changes, $f_{max}$ is also selected higher than or equal to $f_g$.

The exemplary embodiment of FIG. 14 operates with frequency conversion. An error signal $U_{FE}$ that is dependent on the modulation frequency $f_m$ is generated from the frequency-modulated optical signal S output by the semiconductor laser 1. This error signal $U_{FE}$ is at least approximately proportional with a defined proportionality constant d·b to the thermal low-pass part $F(f_m)$ of the frequency transfer function of the semiconductor laser 1 and to the modulating voltage $u_M$.

An electrically controllable frequency converter 17 that effects a frequency conversion of the signal frequency $f_s$ of the frequency-modulated optical signal S is controlled with this electrical error signal $U_{FE}$.

The proportionality constant d·b of the error signal $U_{FE}$ is selected such that the frequency-converted optical frequency $f_{s'}$ of an optical output signal S' is obtained at an output 170 of the frequency converter 17, is essentially proportional to the modulating voltage $u_M$ and is not dependent on the thermal low-pass part $F(f_m)$ of the frequency transfer function of the semiconductor laser 1.

When the frequency converter 17 is characterized in that the frequency-converted optical frequency $f_{s'}$ of its optical output signal S' is dependent on the signal frequency $f_s$ of the frequency-modulated optical signal S supplied to it and on an electrical control signal $U_C$ adjacent at a control input 171 of the frequency converter 17 such that $$f_{s'} = f_s + e \cdot U_C + g$$

is valid. The term g is a constant that can also be zero. Then, with the selection $d = -1/e$ and $U_{FE} = U_C$ in combination with the explicit expression $$f_s(f_m) = f_{so} + (a + b \cdot F(f_m)) \cdot u_M(f_m)$$

for the signal frequency $f_s$ of the frequency-modulated optical signal S, the expression $$f_{s'} = f_{so} + a \cdot u_M(f_m) + g$$

results for the frequency-converted optical frequency $f_{s'}$ of the optical output signal S' of the frequency converter 170. The frequency $f_{so}$ denotes the constant carrier frequency of the frequency-modulated optical signal S, the term $a \cdot u_M(f_m)$ denotes the desired, smooth frequency response that is independent of the modulation frequency $f_m$ which indicates that the frequency-converted optical signal S' is free of distortion, and the term g denotes a frequency shift in comparison to the frequency-modulated optical signal from the semiconductor laser 1 that can also be zero.

FIG. 14 shows the circuit-oriented realization of this frequency conversion as a block circuit diagram. The frequency-modulated optical signal from the semiconductor laser 1 is supplied to an input 190 of an optical splitter 19 having two outputs 191 and 192. This splitter 19 divides the supplied, frequency-modulated optical signal S into a signal part supplied to the output 191 and into a signal part supplied to the output 192. The signal part from the output 191 is supplied to an input 172 of the frequency converter 17 for frequency conversion. The part from the output 192 is supplied to an input 184 of an error signal generator 18 that, dependent on this supplied signal part, generates an electrical error signal $U_{FE}$ at an output 185 that is connected to the control input 171 of the frequency converter 17.

A specific realization of the splitter 19 and of the error signal generator 18 can be composed of the circuit part of FIG. 7 that is established by the optical directional coupler 4, the photodetector 5, the amplifier 6 and the frequency discriminator 13 connected to the amplifier 6 via the point 67 whose output signal $U_{DISK}$ is employed as error signal $U_{FE}$ that is supplied to the input 171 of the frequency converter 17. The free, right end of the directional coupler 4 that does not lie opposite the photodetector 5 in FIG. 7 forms the output of the splitter that is connected to the input 172 of the frequency converter 17 in FIG. 14. The positions 14 and 3, as well as the positions 7 through 10 in FIG. 7 are eliminated for the circuit according to FIG. 14.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. (Amended) A method for generating a frequency-modulated optical signal, comprising the steps of:
   providing a semiconductor laser having at least a pump electrode;
   pumping the semiconductor laser with an electrical voltage that is applied to the pump electrode of the semiconductor laser and that modulates with a modulation frequency, the semiconductor laser having a frequency transfer function with a thermal low-pass part that is dependent on the modulation frequency, said low-pass part effecting a distortion of the generated, frequency-modulated optical signal;
   subjecting to distortion, for generating the frequency-modulated optical signal such that the frequency-modulated optical signal is at least partially free of distortion producible by the thermal low-pass part, at least one of:
   a) for a semiconductor laser having in addition to the pump electrode, a further electrode for applying the modulating voltage, the modulating voltage applied to the pump electrode and the modulating voltage applied to the further electrode such that the distorted, modulating voltages together at least partially compensate the distortion of the frequency-modulated optical signal; or
   b) the frequency-modulated optical signal itself in order to compensate a distortion of the frequency-modulated signal with reference to a signal frequency of the frequency-modulated signal; or
   c) for a frequency-modulated, optical superposition signal generated by superimposing the frequency-modulated optical signal with an optical reference signal having a specific, modulatable reference frequency, the reference signal with reference to the reference frequency that at least partially compensates the distortion of the frequency-modulated optical signal contained in the superposition signal.

2. The method according to claim 1, wherein a semiconductor laser is employed whose frequency transfer function with reference to the modulating voltage applied to the pump electrode is at least approximately a linear function of the thermal low-pass part.

3. The method according to claim 2, wherein the linear function of the thermal low-pass part has a proportionality factor of the thermal low-pass part and an additive constant;

wherein the additive constant and a sum of the additive constant and the proportionality factor of the thermal low-pass part are respective positive numerical values; and wherein both the modulating voltage to be supplied to the pump electrode as well as the modulating voltage to the further electrode are distorted with respective filters that the distortion of the frequency-modulated optical signal is at least partially compensated.

4. The method according to claim 2, wherein the linear function of the thermal low-pass part has a proportionality factor of the thermal low-pass part and an additive constant;

wherein the additive constant and a sum of this additive constant and the proportionality factor of the thermal low-pass part are respectively negative numerical values; and wherein at least the modulating voltage to be supplied to the pump electrode is distorted with at least one filter such that the distortion of the frequency-modulated signal is at least partially compensated.

5. The method according to claim 1, wherein the laser with reference to the modulating voltage applied to the further electrode has a transfer function dependent on the modulation frequency that is equal to a low-pass transfer function multiplied by a specific proportionality constant referred to the further electrode, said low-pass transfer function having the value one for low modulation frequencies and having the value zero for extremely high modulation frequencies.

6. The method according to claim 2, wherein the modulating voltage is supplied with high-pass filtering to the pump electrode and is supplied with low-pass filtering to the further electrode.

7. The method according to claim 1, wherein the semiconductor laser is a TTG laser.

8. The method according to claim 2, wherein with which frequency ranges of the modulation frequency, wherein a magnitude of a modulation sensitivity referred to the pump electrode that is established by a relationship dependent on the modulation frequency between a change of the signal frequency of the frequency-modulated optical signal and a change of the modulating voltage to be applied to the pump electrode and/or a magnitude of a modulation sensitivity referred to the further electrode which is established by a relationship dependent on the modulation frequency between a change of the signal frequency of the frequency-modulated optical signal and a change of the modulating voltage to be applied to the further electrode that causes this change, has at least an approximately flat curve and covers an entire range between a lowest-first frequency and a second frequency that is higher in comparison to this first frequency.

9. The method according to claim 8, wherein a semiconductor laser is employed, whereby the magnitude of the modulation sensitivity referred to the pump electrode has at least an approximately flat curve at least in a frequency range between a defined, third frequency of the modulation frequency that is higher in comparison to the first frequency and lower in comparison to the second frequency, as well as for modulation frequencies that are higher than a defined, fourth frequency that is higher in comparison to the third frequency, and whereby the magnitude of the modulation sensitivity referred to the further electrode has at least an approximately flat curve at least in a frequency range between the first frequency and a fifth frequency of the modulation frequency that is higher in comparison to the fourth frequency.

10. The method according to claim 1, wherein the method further comprises the steps of: generating an electrical error signal from the frequency-modulated optical signal output by the semiconductor laser, said electrical error signal being at least approximately proportional with a specific proportionality constant to the thermal low-pass part of the frequency transfer function of the semiconductor laser and to the modulating voltage; controlling a controllable frequency converter with this error signal, said controllable frequency converter effecting a frequency shift of the signal frequency of the frequency-modulated optical signal; and selecting the proportionality constant of the error signal such that the optical frequency of an optical output signal at an output of the frequency converter is essentially proportional to the modulated voltage and is independent of the thermal low-pass part of the frequency transfer function of the semiconductor laser.

11. The method according to claim 1, wherein the method further comprises the steps of: generating an amplitude signal that is dependent on an intermediate frequency of an intermediate frequency signal acquired from the superimposed signal such that said amplitude signal with reference to a specific amplitude level has at least two level crossings with slopes inclined in a same direction at two respective specific characteristic frequency values of the intermediate frequency that differ from one another; and, when the frequency-modulated optical signal output by the semiconductor laser is undistorted, intermediate frequency values occur that are equal to the characteristic frequency values; and at least approximately adjusting back, given a frequency-related deviation of the intermediate frequency values from the characteristic frequency values, the intermediate frequency values in turn to the characteristic frequency values by a change of the reference frequency of the reference signal that is effected by an output signal generated from a constantly identified amplitude level of the amplitude signal.

12. The method according to claim 1, wherein the method further comprises the steps of: deriving a signal that corresponds to the modulating voltage from an intermediate frequency signal acquired from the optical superimposed signal; and distorting the derived signal with a low-pass filter part of the frequency transfer function that is dependent on the modulation frequency that is at least approximately equal to a transfer function of the semiconductor laser that is dependent on the modulation frequency; and generating, by means of the distorted derived signal, a frequency modulation impressed on the reference signal for at least partial compensation of the distortion of the frequency-modulated optical signal that is contained in the intermediate frequency signal.

13. The method according to claim 12, wherein the method further comprises the steps of: continuously checking the signal dependent on the intermediate frequency to determine whether, at the characteristic frequency values, a deviation of an actual amplitude level of this signal from a specific amplitude level and, thus, a deviation of the intermediate frequency values from the characteristic frequency values is present; generating an optical signal that is dependent on such a deviation; and producing, by means of said output signal and the distorted signal superimposed on one another, a change of the reference frequency of the reference signal for at least partial compensation of the distortion of the frequency-modulated optical signal that is contained in the superimposition signal.

14. The method according to claim 1, wherein the method further comprises the steps of: deriving a signal that corresponds to the modulating voltage from an intermediate frequency signal acquired from the superimposition signal; supplying the modulating voltage to the semiconductor laser pre-distorted by a high-pass transfer function for the modulation frequency; distorting the derived signal by a low-pass transfer function of the modulation frequency that is at least approximately complementary to the high-pass transfer function; and generating, by means of said distorted signal, a frequency modulation impressed on the reference signal for at least partial compensation of a distortion of the frequency-modulated optical signal that is contained in the superimposition signal.

15. An apparatus for generating a frequency modulated optical signal, comprising:
a semiconductor laser having a pump electrode and a further electrode;
an electrical voltage that is applied to the pump electrode of the semiconductor laser and that modulates with a modulation frequency, the semiconductor laser having a frequency transfer function with a thermal low-pass part that is dependent on the modulation frequency, said low-pass part effecting a distortion of the generated, frequency-modulated optical signal;
a high-pass filter means for high-pass filtering of the modulating voltage to be supplied to the pump electrode of the semiconductor laser;
a low-pass filter means for low-pass filtering of the modulating voltage to be supplied to the further electrode of the semiconductor laser;
the low-pass filter means having a predetermined low-pass transfer function for the modulation frequency that has a value one for modulation frequencies that are extremely low in comparison to a predetermined frequency and that has a value zero for modulation frequencies that are extremely high in comparison to the predetermined frequency; and
the high-pass means having a high-pass transfer function is equal to a value of one minus the low-pass transfer function of the low-pass filter means;
wherein the frequency-modulated signal is generated at least partially free of the distortion caused by the thermal low-pass part.

16. The apparatus according to claim 15, wherein a magnitude of a modulation sensitivity referred to the pump electrode that is established by a relationship dependent on the modulation frequency between a change of the signal frequency of the frequency-modulated optical signal and a change of the modulating voltage to be applied to the pump electrode and a magnitude of a modulation sensitivity referred to the further electrode which is established by a relationship dependent on the modulation frequency between a change of the signal frequency of the frequency-modulated optical signal and a change of the modulating voltage to be applied to the further electrode that causes this change, has at least an approximately flat curve and covers an entire range between a lowest-first frequency and a second frequency that is higher in comparison to this first frequency, and wherein the magnitude of the modulation sensitivity referred to the pump electrode has at least an approximately flat curve at least in a frequency range between a defined, third frequency of the modulation frequency that is higher in comparison to the first frequency and lower in comparison to the second frequency, as well as for modulation frequencies that are higher than a defined, fourth frequency that is higher in comparison to the third frequency, and the magnitude of the modulation sensitivity referred to the further electrode has at least an approximately flat curve at least in a frequency range between the first frequency and a fifth frequency of the modulation frequency that is higher in comparison to the fourth frequency, and wherein the predetermined frequency lies between the fourth frequency and the fifth frequency.

17. The apparatus according to claim 15, wherein the apparatus further comprises a multiplication means preceding or following the low-pass filter means for multiplying the unfiltered, modulating voltage or the modulating voltage filtered by this low-pass filter means by a factor that is equal to an additive constant of the frequency transfer function in the form of a linear function of the thermal low-pass part of this frequency transfer function divided by a specific proportionality constant referred to the further electrode.

18. The apparatus according to claim 15, wherein the apparatus further comprises a multiplication means preceding or following the high-pass filter means for multiplying the unfiltered, modulating voltage or the modulating voltage filtered by this high-pass filter means with a factor that is equal to a specific proportionality constant referred to the further electrode divided by an additive constant of the frequency transfer function in the form of a linear function of the thermal low-pass part of this frequency transfer function.

19. The apparatus according to claim 15, wherein the high-pass filter means has a capacitor connected into a signal path for the modulating voltage that leads to the pump electrode of the semiconductor laser and has a resistor connected between this signal path and a reference potential.

20. The apparatus according to claim 15, wherein the low-pass filter means has a resistor connected into a signal path for the modulating voltage that leads to the further electrode of the semiconductor laser and has a capacitor connected between the second signal path and a reference potential.

21. The apparatus according to claim 15, wherein the low-pass filter means has an inductance connected in a signal path for the modulating voltage that leads to the further electrode of the semiconductor laser and has a resistor connected between this signal path and the reference potential.

22. The apparatus according to claim 15, wherein the high-pass filter means has a capacitor connected into a signal path for the modulating voltage that leads to the pump electrode of the semiconductor laser and has a resistor connected between this signal path and a reference potential, wherein the low-pass filter means has a resistor connected into a signal path for the modulating voltage that leads to the further electrode of the semiconductor laser and has a capacitor connected between the second signal path and a reference potential, and wherein a capacitance of the capacitor and a value of resistance of the resistor of the high-pass filter means as well as a value of resistance of the resistor and a capacitance of the capacitor of the low-pass filter means are selected such that a product of the high-pass filter means formed of the capacitance and the value of resistance is equal to a product formed from the value of resistance and from the capacitance of the low-pass filter means.

23. The apparatus according to claim 15, wherein the high-pass filter means has a capacitor connected into a signal path for the modulating voltage that leads to the pump electrode of the semiconductor laser and has a resistor connected between this signal path and a reference potential, wherein the low-pass filter means has an inductance connected in a signal path for the modulating voltage that leads the further electrode of the semiconductor laser and has a resistor connected between this signal path and the reference potential, and wherein a capacitance of the capacitor and a value of resistance of the resistor of the high-pass filter means as well as an inductance of the inductor and a value of resistance of the resistor of the low-pass filter means are selected such that a product formed of the capacitance and the value of resistance of the high-pass filter means is equal to a quotient of the inductance of the low-pass filter means divided by the value of resistance thereof.

24. An apparatus for generating a frequency modulated optical signal, comprising:
a semiconductor laser having at least a pump electrode;
an electrical voltage that is applied to the pump electrode of the semiconductor laser and that modulates with a modulation frequency, the semiconductor laser having a frequency transfer function with a thermal low-pass part that is dependent on the modulation frequency, said low-pass part effecting a distortion of the generated, frequency-modulated optical signal;
an amplitude signal that is dependent on an intermediate frequency of an intermediate frequency signal acquired from the superimposed signal being generated such that said amplitude signal with reference to a specific amplitude level has at least two level crossings with slopes inclined in a same direction at two respective specific characteristic frequency values of the intermediate frequency that differ from one another and, when the frequency-modulated optical signal output by the semiconductor laser is undistorted, intermediate frequency values occur that are equal to the characteristic frequency values, and given a frequency-related deviation of the intermediate frequency values from the characteristic frequency values, the intermediate frequency values being in turn at least approximately adjusted back to the characteristic frequency values by a change of the reference frequency of the reference signal that is effected by an output signal generated from a constantly identified amplitude level of the amplitude signal;
a frequency discriminator for generating the amplitude signal that is dependent on the intermediate frequency from the intermediate frequency signal; and
a control means, whereby a continuously identified amplitude level of the amplitude signal is used as an actual value and a specific amplitude level is used as a rated value, said control means generating an output signal that is dependent on a deviation of this actual value from this rated value that is supplied as a control signal to a frequency-modulatable, optical reference signal transmitter generating the reference signal for the purpose of a change of the reference frequency of the reference signal such that the deviation of the actual value from the rated value is at least approximately eliminated;
wherein a frequency-modulated signal is generated that is at least partially free of the distortion caused by the thermal low-pass part.

25. The apparatus according to claim 24, wherein the apparatus further comprises a frequency-modulatable, optical reference signal transmitter that generates the reference signal and has a frequency modulation characteristic that is at least approximately constant over a modulation frequency range provided for the frequency-modulated optical signal.

26. The apparatus according to claim 25, wherein the frequency-modulatable reference signal transmitter that generates the reference signal is a tunable TTG laser.

27. An apparatus for generating a frequency modulated optical signal, comprising:
a semiconductor laser having at least a pump electrode;
an electrical voltage that is applied to the pump electrode of the semiconductor laser and that modulates with a modulation frequency, the semiconductor laser having a frequency transfer function with a thermal low-pass part that is dependent on the modulation frequency, said low-pass part effecting a distortion of the generated, frequency-modulated optical signal;
a signal that corresponds to the modulating voltage being derived from an intermediate frequency signal acquired from the optical superimposed signal, the derived signal being distorted with a low-pass filter part of the frequency transfer function that is dependent on the modulation frequency that is at least approximately equal to a transfer function of the semiconductor laser that is dependent on the modulation frequency, and this distorted signal being employed for generating a frequency modulation impressed on the reference signal for at least partial compensation of the distortion of the frequency-modulated optical signal that is contained in the intermediate frequency signal;
a means for generating an optical superimposition signal by superimposition of the frequency-modulated optical signal output by the semiconductor laser and the reference signal that is generated by an optical reference semiconductor laser and has the specific reference frequency;
a means for generating an electrical intermediate frequency signal from the optical superimposition;
a means for generating the derived signal that at least approximately corresponds to the modulating voltage from the intermediate frequency signal; and a means for quantized feedback of the derived signal to a reference signal transmitter that generates the reference signal and for distorting the derived signal with the transfer function that is at least approximately equal to the low-pass part of the frequency transfer function the semiconductor laser, the reference signal transmitter being an optical transmitter that can be frequency-modulated by the distorted derived signal from the means for quantized feedback;

wherein the frequency-modulated signal is generated at least partially free of the distortion caused by the thermal low-pass part.

28. The apparatus according to claim 27, wherein the apparatus further comprises an adder or subtractor means for superimposing the output signal that is dependent on a deviation of the actual value from the rated value and the distorted derived signal and supplying these signals superimposed on one another to the frequency-modulatable reference signal transmitter.

29. An apparatus for generating a frequency modulated optical signal, comprising:

a semiconductor laser having at least a pump electrode;

an electrical voltage that is applied to the pump electrode of the semiconductor laser and that modulates with a modulation frequency, the semiconductor laser having a frequency transfer function with a thermal low-pass part that is dependent on the modulation frequency, said low-pass part effecting a distortion of the generated, frequency-modulated optical signal;

a signal that corresponds to the modulating voltage being derived from an intermediate frequency signal acquired from the superimposition signal, the modulating voltage being supplied to the semiconductor laser pre-distorted by a high-pass transfer function for the modulation frequency, the derived signal being distorted by a low-pass transfer function of the modulation frequency that is at least approximately complementary to the high-pass transfer function, and this distorted signal being employed for generating a frequency modulation impressed on the reference signal for at least partial compensation of a distortion of the frequency-modulated optical signal that is contained in the superimposition signal;

a high-pass filter means having a specific high-pass transfer function for high-pass filtering of the modulating voltage to be applied to the pump electrode of the semiconductor laser;

a means for generating an optical superimposition signal by superimposing the frequency-modulated optical signal output by the semiconductor laser and the optical reference signal that is generated by an optical reference signal transmitter and has the specific reference frequency;

a means for generating the derived signal that at least approximately corresponds to the modulation signal from the optical superimposition signal; and a means for quantized feedback of the derived signal to a reference semiconductor laser that generates the reference signal and for distorting the derived signal with the low-pass transfer function that is at least approximately complementary to the high-pass transfer function, the reference semiconductor laser being an optical transmitter than can be frequency-modulated by the distorted derived signal;

wherein the frequency-modulated signal is generated at least partially free of the distortion caused by the thermal low-pass part.

30. An apparatus for generating a frequency modulated optical signal, comprising:

a semiconductor laser having at least a pump electrode;

an electrical voltage that is applied to the pump electrode of the semiconductor laser and that modulates with a modulation frequency, the semiconductor laser having a frequency transfer function with a thermal low-pass part that is dependent on the modulation frequency, said low-pass part effecting a distortion of the generated, frequency-modulated optical signal;

an electrical error signal generated from the frequency-modulated optical signal output by the semiconductor laser, said electrical error signal being at least approximately proportional with a specific proportionality constant to the thermal low-pass part of the frequency transfer function of the semiconductor laser and to the modulating voltage;

a controllable frequency converter controlled with said error signal, said controllable frequency converter effecting a frequency shift of the signal frequency of the frequency-modulated optical signal, the proportionality constant of the error signal being selected such that the optical frequency of an optical signal at an output of the frequency converter is essentially proportional to the modulated voltage and is independent of the thermal low-pass part of the frequency transfer function of the semiconductor laser;

an optical splitter for dividing the frequency-modulated optical signal into two signal parts;

the controllable frequency converter, to which one of the two signal parts is supplied, effecting a frequency conversion at the supplied signal part dependent on a supplied control signal; and an error signal generator to which the other signal part is supplied and which, dependent on this signal part, generates an error signal that is supplied to the frequency converter as a control signal;

wherein the frequency-modulated signal is generated at least partially free of the distortion caused by the thermal low-pass part.

31. The method according to claim 5, wherein the modulating voltage is supplied with high-pass filtering to the pump electrode and is supplied with low-pass filtering to the further electrode.

32. The method according to claim 5, wherein with which frequency ranges of the modulation frequency, wherein a magnitude of a modulation sensitivity referred to the pump electrode that is established by a relationship dependent on the modulation frequency between a change of the signal frequency of the frequency-modulated optical signal and a change of the modulating voltage to be applied to the pump electrode and/or a magnitude of a modulation sensitivity referred to the further electrode which is established by a relationship dependent on the modulation frequency between a change of the signal frequency of the frequency-modulated optical signal and a change of the modulating voltage to be applied to the further electrode that causes this change, has at least an approximately flat curve and covers an entire range between a lowest-first frequency and a second frequency that is higher in comparison to this first frequency.

33. The method according to claim 32, wherein a semiconductor laser is employed, whereby the magnitude of the modulation sensitivity referred to the pump electrode has at least an approximately flat curve at least in a frequency range between a defined, third frequency of the modulation frequency that is higher in comparison to the first frequency and lower in comparison to the second frequency, as well as for modulation frequencies that are higher than a defined, fourth frequency that is higher in comparison to the third frequency, and whereby the magnitude of the modulation sensitivity referred to the further electrode has at least an approximately flat curve at least in a frequency range between the first frequency and a fifth frequency of the modulation frequency that is higher in comparison to the fourth frequency.

34. The method according to claim 7, wherein with which frequency ranges of the modulation frequency, wherein a magnitude of a modulation sensitivity referred to the pump electrode that is established by a relationship dependent on the modulation frequency between a change of the signal frequency of the frequency-modulated optical signal and a change of the modulating voltage to be applied to the pump electrode and/or a magnitude of a modulation sensitivity referred to the further electrode which is established by a relationship dependent on the modulation frequency between a change of the signal frequency of the frequency-modulated optical signal and a change of the modulating voltage to be applied to the further electrode that causes this change, has at least an approximately flat curve and covers an entire range between a lowest-first frequency and a second frequency that is higher in comparison to this first frequency.

35. The method according to claim 34, wherein a semiconductor laser is employed, whereby the magnitude of the modulation sensitivity referred to the pump electrode has at least an approximately flat curve at least in a frequency range between a defined, third frequency of the modulation frequency that is higher in comparison to the first frequency and lower in comparison to the second frequency, as well as for modulation frequencies that are higher than a defined, fourth frequency that is higher in comparison to the third frequency, and whereby the magnitude of the modulation sensitivity referred to the further electrode has at least an approximately flat curve at least in a frequency range between the first frequency and a fifth frequency of the modulation frequency that is higher in comparison to the fourth frequency.

36. The method according to claim 11, wherein the method further comprises the steps of: continuously checking the signal dependent on the intermediate frequency to determine whether, at the characteristic frequency values, a deviation of an actual amplitude level of this signal from the specific amplitude level and, thus, a deviation of the intermediate frequency values from the characteristic frequency values is present; generating an optical signal that is dependent on such a deviation; and producing, by means of said output signal and the distorted signal superimposed on one another, a change of the reference frequency of the reference signal for at least partial compensation of the distortion of the frequency-modulated optical signal that is contained in the superimposition signal.

37. The apparatus according to claim 19, wherein the low-pass filter means has an inductance connected in a signal path for the modulating voltage that leads to the further electrode of the semiconductor laser and has a resistor connected between this signal path and the reference potential.

38. The apparatus according to claim 24, wherein the apparatus further comprises an adder or subtractor means for superimposing the output signal that is dependent on a deviation of the actual value from the rated value and the distorted derived signal and supplying these signals superimposed on one another to the frequency-modulatable reference signal transmitter.

* * * * *